(12) United States Patent
Hino et al.

(10) Patent No.: US 8,044,399 B2
(45) Date of Patent: Oct. 25, 2011

(54) DISPLAY DEVICE

(75) Inventors: Aya Hino, Kobe (JP); Hiroshi Gotou, Kobe (JP); Hiroyuki Okuno, Kobe (JP); Junichi Nakai, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 252 days.

(21) Appl. No.: 12/376,863

(22) PCT Filed: Sep. 13, 2007

(86) PCT No.: PCT/JP2007/067848
§ 371 (c)(1),
(2), (4) Date: Feb. 9, 2009

(87) PCT Pub. No.: WO2008/032786
PCT Pub. Date: Mar. 20, 2008

(65) Prior Publication Data
US 2010/0163877 A1    Jul. 1, 2010

(30) Foreign Application Priority Data

Sep. 15, 2006 (JP) ................................. 2006-251473
Aug. 10, 2007 (JP) ................................. 2007-210218

(51) Int. Cl.
*H01L 29/04* (2006.01)
*H01L 31/036* (2006.01)
*H01L 31/0376* (2006.01)
*H01L 31/20* (2006.01)

(52) U.S. Cl. ..................... 257/59; 257/72; 257/E29.117

(58) Field of Classification Search .................... 257/59, 257/72, 347, E29.117, E29.273, 765
See application file for complete search history.

(56) References Cited

U.S. PATENT DOCUMENTS

| 5,162,933 | A  | 11/1992 | Kakuda et al. |
| 5,514,909 | A  | 5/1996  | Yamamoto et al. |
| 6,033,542 | A  | 3/2000  | Yamamoto et al. |
| 6,096,438 | A  | 8/2000  | Takagi et al. |
| 6,218,206 | B1 | 4/2001  | Inoue et al. |
| 6,252,247 | B1 | 6/2001  | Sakata et al. |

(Continued)

FOREIGN PATENT DOCUMENTS

CN           1327168 A           12/2001

(Continued)

OTHER PUBLICATIONS

U.S. Appl. No. 12/681,542, filed Apr. 2, 2010, Ochi, et al.

(Continued)

*Primary Examiner* — Hoai V Pham
(74) *Attorney, Agent, or Firm* — Oblon, Spivak, McClelland, Maier & Neustadt, L.L.P.

(57) ABSTRACT

A display has a glass substrate provided with a transparent conducting film, thin-film transistors, and an aluminum alloy wiring film electrically connecting the thin-film transistors to the transparent conducting film. The aluminum alloy wiring film is a layered structure having a first layer (X) of an aluminum alloy comprising at least one element selected from the specific element group Q including Ni and Ag, and at least one element selected from the specific element group R including rare-earth elements and Mg in a content in the specific range, and a second layer (Y) of an aluminum alloy containing having a resistivity lower than that of the first layer (X). The first layer (X) is in direct contact with the transparent conducting film.

15 Claims, 14 Drawing Sheets

U.S. PATENT DOCUMENTS

| | | |
|---|---|---|
| 7,098,539 B2 | 8/2006 | Gotoh et al. |
| 7,154,180 B2 | 12/2006 | Gotoh et al. |
| 7,262,085 B2 | 8/2007 | Gotoh et al. |
| 7,365,810 B2 | 4/2008 | Gotoh et al. |
| 7,411,298 B2 | 8/2008 | Kawakami et al. |
| 2003/0047812 A1 | 3/2003 | Hagihara et al. |
| 2004/0126608 A1 | 7/2004 | Gotoh et al. |
| 2005/0224795 A1* | 10/2005 | Gotoh et al. ............ 257/59 |
| 2006/0091792 A1 | 5/2006 | Kugimiya et al. |
| 2006/0180250 A1 | 8/2006 | Kugimiya et al. |
| 2006/0181198 A1 | 8/2006 | Gotoh et al. |
| 2006/0237849 A1 | 10/2006 | Gotoh et al. |
| 2006/0275618 A1 | 12/2006 | Kugimiya et al. |
| 2007/0040173 A1 | 2/2007 | Kugimiya et al. |
| 2008/0081532 A1 | 4/2008 | Okuno |
| 2008/0121522 A1 | 5/2008 | Ehira et al. |
| 2008/0223718 A1 | 9/2008 | Takagi et al. |
| 2008/0315203 A1 | 12/2008 | Hino et al. |

FOREIGN PATENT DOCUMENTS

| | | |
|---|---|---|
| CN | 1508615 A | 6/2004 |
| JP | 4 20930 | 1/1992 |
| JP | 11 283934 | 10/1999 |
| JP | 11 284195 | 10/1999 |
| JP | 11 337976 | 12/1999 |
| JP | 2001 350159 | 12/2001 |
| JP | 2003 273109 | 9/2003 |
| JP | 2004 214606 | 7/2004 |

OTHER PUBLICATIONS

U.S. Appl. No. 12/812,913, filed Jul. 14, 2010, Ochi, et al.
U.S. Appl. No. 12/918,727, filed Aug. 20, 2010, Miki, et al.
U.S. Appl. No. 12/922,764, filed Sep. 15, 2010, Goto, et al.
U.S. Appl. No. 12/922,965, filed Sep. 16, 2010, Nakai, et al.
U.S. Appl. No. 12/936,572, filed Oct. 6, 2010, Kawakami, et al.
U.S. Appl. No. 12/444,267, filed Apr. 3, 2009, Hino, et al.
U.S. Appl. No. 12/131,444, filed Jun. 2, 2008, Gotou.
U.S. Appl. No. 12/131,493, filed Jun. 2, 2008, Gotou, et al.
U.S. Appl. No. 12/136,409, filed Jun. 10, 2008, Ochi, et al.
U.S. Appl. No. 12/528,008, filed Aug. 20, 2009, Gotou, et al.
U.S. Appl. No. 12/312,907, Jun. 1, 2009, Gotou, et al.
U.S. Appl. No. 13/122,937, filed Apr. 6, 2011, Nanbu, et al.
U.S. Appl. No. 13/126,126, filed Apr. 26, 2011, Ochi, et al.
U.S. Appl. No. 12/999,034, filed Dec. 14, 2010, Kawakami, et al.
U.S. Appl. No. 13/056,444, Jan. 28, 2011, Onishi, et al.

* cited by examiner

2μm

2 μm

DISPLAY DEVICE

CROSS-REFERENCE TO RELATED APPLICATIONS

This application is a 371 of PCT/JP07/67848 filed Sep. 13, 2007 and claims the benefit of JP 2006-251473 filed Sep. 15, 2006 and JP 2007-210218 filed Aug. 10, 2007.

TECHNICAL FIELD

The present invention relates to an innovative display including a transparent conducting film, which is employed in forming reflecting films and optical parts, and an aluminum alloy wiring film, such as a semiconductor device or a flat panel display, such as a liquid crystal display.

BACKGROUND ART

An active matrix liquid crystal display includes a TFT substrate (TFT array substrate) provided with thin-film transistors (TFTs) as switching devices, a transparent conducting film and a wiring unit including gate, source and drain lines; a counter substrate disposed opposite to and separated by a space from the TFT substrate and provided with common electrodes; and a liquid crystal layer filling up the space between the TFT substrate and the counter substrate. The transparent conducting film is, for example, an indium tin oxide film (ITO film) of indium oxide ($In_2O_3$) containing about 10% by mass tin oxide (SnO) or an indium zinc oxide film (IZO film) of indium oxide containing 10% by mass zinc oxide.

FIG. 1 is a schematic, enlarged sectional view of a liquid crystal panel included in such a liquid crystal display. This liquid crystal panel includes a TFT array substrate 1, a counter substrate 2 disposed opposite to the TFT array substrate 1, and a liquid crystal layer 3 sandwiched between the TFT array substrate 1 and the counter substrate 2 and serving as a light modulator layer. The TFT array substrate 1 includes an insulating glass substrate 1*a*, thin-film transistors (TFTs) 4 arranged on the glass substrate 1*a*, transparent conducting film 5 forming pixel electrodes, and a wiring unit 6 including scanning lines and signal lines.

The counter substrate 2 includes common electrodes 7 formed on a surface thereof facing the TFT array substrate 1, a color filter 8 facing the transparent conducting film 5 (pixel electrodes), and a shading film 9 facing the thin-film transistors (TFTs) 4 and the wiring unit 6 of the TFT array substrate 1.

Polarizers 10 are attached to the outer surfaces of the TFT array substrate 1 and the counter substrate 2, respectively. The counter substrate 2 is provided with a liquid crystal alignment film 11 for aligning liquid crystals with a predetermined direction.

An alignment direction with which the liquid crystal molecules are to be aligned is controlled by an electric field created between the counter electrode 2 and the transparent conducting film (pixel electrodes) 5 to modulate light passing through the liquid crystal layer 3 formed between the TFT array substrate and the counter electrode 2. Thus, the quantity of light that passes through the counter substrate 2 is controlled to form an image.

The TFT array is driven through a TAB tape 12 connected to the TFT array by a drive circuit 13 and a control circuit 14. Shown also in FIG. 1 are a spacer 15, a sealing material 16, a protective film 17, a diffusion plate 18, a prism sheet 19, a light guide plate 20, a reflecting plate 21, a back light 22, a holding frame 23 and a printed wiring board 24.

FIG. 2 is an enlarged view of a part A shown in FIG. 1 and including the wiring unit 6 electrically connected to the transparent conducting film (pixel electrodes) 5. The gate line 26 shown in FIG. 2 is a layered wiring film formed by superposing a film of a metal, such as Mo or Cr, or an aluminum alloy film of, for example, An Al—Nd alloy, and a film of a refractory metal, such as Mo, Cr, Ti or W. A source line 28 and a drain line 29 (referred to as source•drain lines in some cases) are layered film each of a single-layer film of pure aluminum (Al) and a film of the foregoing refractory metal as mentioned in, for example, Patent documents 1, 2 and 3.

The film of the refractory metal is used for the following reasons. When the transparent film (ITO film) 5 is connected directly to the film of pure aluminum or an aluminum alloy, such as an Al—Nd alloy, forming the gate lines and the source•drain lines, aluminum is oxidized and a aluminum oxide layer having high resistivity is formed between the transparent conducting film and the pure aluminum film or the aluminum alloy film, such as an Al—Nd film. Consequently, contact resistance between the signal line and the transparent conducting film increases to deteriorate the image quality of displayed images.

Since aluminum is an element that can be readily oxidized, an aluminum oxide film is formed in the atmosphere. An aluminum oxide film having high resistivity is formed particularly by oxygen used for forming the transparent conducting film of a metal oxide or by oxygen produced in a film forming process.

The oxidation of the surface of a pure aluminum film or an aluminum alloy film is prevented by using a barrier metal (refractory metal) layer to ensure satisfactory contact between a pure aluminum or aluminum alloy film and a transparent conducting film.

An additional process for forming the metal barrier layer is necessary to build a structure including the metal barrier layer, and an additional apparatus for forming the metal barrier layer is necessary in addition to a sputtering apparatus for forming a film for forming gate lines and source•drain lines. Increase in the cost and the reduction of productivity resulting from the formation of the metal barrier layer have become problems with the progress of the reduction of the cost of the liquid crystal display panel by mass production. There has been a demand for electrode materials and manufacturing processes effective in omitting the metal barrier layer in recent years. The inventors of the present invention have previously proposed an aluminum alloy wiring film capable of simplifying the metal barrier layer forming process and of being in direct contact with the transparent conducting film in Patent document 4.

Disclosed in Patent document 5 is a technique that enables the omission of a metal barrier layer by subjecting a drain electrode to a surface treatment process, such as a plasma process or an ion implantation process. Disclosed in Patent document 6 is a technique that enables the omission of a metal barrier layer by using a layered wiring film formed by superposing a second layer containing impurities, such as N, O, Si and C, to a first layer for forming gate, source and drain electrodes.

The length of wiring lines has increased with the progressive increase in size of liquid crystal display panels and the resistivity of signal lines has increased greatly accordingly. The increased resistivity causes RC delay which is can deteriorate the image quality of displayed images. Accordingly, demand for wiring lines having low resistivity has increased and wiring materials having low resistivity, such as pure Al, are used for forming wiring lines having low resistivity.

When a transparent conducting film is brought into direct contact with pure aluminum or aluminum alloy wiring lines, contact resistance increases and the display quality of the screen is deteriorated. Such a problem arises because aluminum is oxidized easily as mentioned above, the surfaces of wiring lines are readily oxidized in the atmosphere, and an insulating aluminum oxide film is formed on the surfaces of the wiring lines by the oxidation of aluminum by oxygen used for forming the transparent conducting film of a metal oxide. If an insulating film is formed between the signal lines and the transparent conducting film, contact resistance between the signal lines and the transparent conducting film increases and hence the display quality of the screen deteriorates.

A metal barrier layer used in conventional liquid crystal display panels prevents the oxidation of the pure aluminum wiring lines or aluminum alloy wiring lines and ensures the satisfactory contact between the transparent conducting film and the pure aluminum wiring lines or the aluminum alloy wiring lines. Since refractory metal, such as Mo, Cr, Ti or W, used for forming the metal barrier layer has high resistivity, increase in the resistance of wiring lines due to the use of the metal barrier layer is unignorable.

Difficulty in fine processing is one of disadvantages of using a metal barrier layer. Usually, it is considered to be desirable that the sectional shape of a wiring line is tapered at a taper angle in the range of about 45° to about 60° considering satisfactory coverage. Since a wiring line of a layered film including a metal barrier layer have layers of different metals. Therefore, the metal layers of different metals are etched at different etch rate, respectively, and in some cases, has a sectional shape as schematically shown in FIG. 3. Since metals respectively having different potentials are joined, the galvanic corrosion of the wiring line occurs and, in some cases, the wiring line has a sectional shape shown in FIG. 4. When wiring lines have such a sectional shape, a passivation film cannot be formed in satisfactory coverage and the operating characteristic of the TFTs (thin-film transistors) is deteriorated.

Moreover, for example, the heat resistance of pure aluminum wiring lines is unsatisfactory and protruding defects called hillocks are formed. When the hillocks penetrates the insulating film, wiring lines are short-circuited. Thus the reduction of the yield of a production line due to the use of pure aluminum is a practically significant problem.

Patent document 1: JP H4-20930 A
Patent document 2: JP H6-12503 A
Patent document 3: JP 2001-350159 A
Patent document 4: JP 2004-214606 A
Patent document 5: JP H11-238934 A
Patent document 6: JP H11-284195 A

DISCLOSURE OF THE INVENTION

The present invention has been made in view of the foregoing problems and it is therefore an object of the present invention to provide a low-resistivity wiring line as mentioned above, and to provide a display provided with a wiring film excellent in fine-processability and having heat resistance capable of satisfactorily withstanding heat that is applied thereto in manufacturing processes.

The present invention relates to the following items (1) to (9).

(1) A display comprising a glass substrate provided with a transparent conducting film, thin-film transistors, and an aluminum alloy wiring film electrically connecting the thin-film transistors to the transparent conducting film; wherein the aluminum alloy wiring film is a layered structure having a first layer (X) of an aluminum alloy comprising at least one element selected from the element group Q consisting of Ni, Ag, Zn and Cu in a content in the range of 0.1 to 6 at. % (sometimes simply referred to as the element group Q hereinbelow), and at least one element selected from the element group R consisting of rare-earth elements, Mg, Mn, V, Pt, Cr, Ru, Rh, Pd, Ir, W, Ti, Zr, Nb, Hf, Ta, Sn and Fe (sometimes simply referred to as the element group R hereinbelow) in a content in the range of 0.1 to 6 at. %, and a second layer (Y) of pure aluminum or an aluminum alloy containing aluminum as a principal component and having a resistivity lower than that of the first layer (X), and the first layer (X) is in direct contact with the transparent conducting film.

(2) A display comprising a glass substrate provided with a transparent conducting film, thin-film transistors, and an aluminum alloy wiring film electrically connecting the thin-film transistors to the transparent conducting film; wherein the aluminum alloy wiring film is a layered structure having a first layer (X) of an aluminum alloy comprising at least one element selected from the element group Q' consisting of Ni, Ag, Zn, Cu and Co in a content in the range of 0.1 to 6 at. % (sometimes simply referred to as the element group Q' hereinbelow), and at least one element selected from the element group R consisting of rare-earth elements, Mg, Mn, V, Pt, Cr, Ru, Rh, Pd, Ir, W, Ti, Zr, Nb, Hf, Ta, Sn and Fe (sometimes simply referred to as the element group R hereinbelow) in a content in the range of 0.1 to 6 at. %, and a second layer (Y) of pure aluminum or an aluminum alloy containing aluminum as a principal component and having resistivity lower than that of the first layer (X), and the first layer (X) is in direct contact with the transparent conducting film.

(3) A display comprising a glass substrate provided with a transparent conducting film, thin-film transistors, and an aluminum alloy wiring film electrically connecting the thin-film transistors to the transparent conducting film; wherein the aluminum alloy wiring film is a layered structure having a first layer (X) of an aluminum alloy comprising at least one element selected from the element group Q' consisting of Ni, Ag, Zn, Cu and Co (sometimes simply referred to as the element group Q' hereinbelow) in a content in the range of 0.1 to 6 at. %, and at least one element selected from the rare-earth element group R1 (sometimes simply referred to as the element group R1 hereinbelow, preferably one element selected from one element group consisting of La (lanthanum), Gd, Y, Nd and Dy) and at least one element selected from the element group R2 consisting of Mg, Mn, V, Pt, Cr, Ru, Rh, Pd, Ir, W, Ti, Zr, Nb, Hf, Ta, Sn and Fe (sometimes simply referred to as the element group R2 hereinbelow, preferably one element selected from one element group consisting of Cr, Ti, Zr, Nb and Ta) in a total content of the element group R1 plus the element group R2 in the range of 0.1 to 6 at. %, and a second layer (Y) of pure aluminum or an aluminum alloy containing aluminum as a principal component and having a resistivity lower than that of the first layer (X), and the first layer (X) is in direct contact with the transparent conducting film. (In the following description, the aluminum alloy wiring film is designated specifically as an aluminum alloy layered wiring film in some cases.)

(4) In the display stated in (3), the rare-earth element group R1 consists of La, Gd, Y, Nd and Dy.

(5) In the display stated in (3), the element group R2 consists of Cr, Ti, Zr, Nb and Ta.

(6) In the display stated in (4), the element group R2 consists of Cr, Ti, Zr, Nb and Ta.

(7) In the display stated in any one of (1) to (6), the first layer (X) has a thickness of 20 nm or above.

(8) In the display stated in anyone of (1) to (6), wiring lines of the aluminum alloy wiring film having the first layer (X) and the second layer (Y) have a resistivity of 4.5 μΩ·cm or below.

(9) In the display stated in (7), wiring lines of the aluminum alloy wiring film having the first layer (X) and the second layer (Y) have a resistivity of 4.5 μΩ·cm or below.

In the present invention, Y (yttrium) shall be included in the rare-earth element group.

In the present invention, it is preferable that the thickness of the first layer (X) is 20 nm or above to exhibit the low resistivity and heat resistance featuring the present invention effectively.

A suitable material of the transparent conducting film, namely, one of the components of the present invention, is indium tin oxide (ITO) or indium zinc oxide (IZO). Preferably, the resistivity of the aluminum alloy wiring film including the first layer (X) and the second layer (Y) is adjusted to 4.5 μΩ·cm or below.

According to the present invention, the wiring film includes the first layer (X) made of an aluminum alloy having high heat resistance, and capable of being in contact with the transparent conducting film, and the second layer (Y) made of pure aluminum or an aluminum alloy having a resistivity lower than that of the aluminum alloy forming the first layer (X). Thus, the wiring film has a low resistivity and high heat resistance, and the aluminum alloy layered wiring film can be in direct contact with the transparent conducting film. Since the layered aluminum alloy wiring film featuring the present invention is built by superposing the pure aluminum or the aluminum alloy layers of the same type, the difference between etch rates at which the layers are etched, respectively, is small and hence the layered aluminum alloy wiring film facilitates forming a pattern and is excellent in fine-processability.

Since the material forming the first layer (X) contains at least one of the elements of the specific element group R2, the corrosion of the aluminum alloy wiring film during processes for forming the display can be suppressed and a display capable of displaying images in high display quality can be manufactured.

Figure 1:
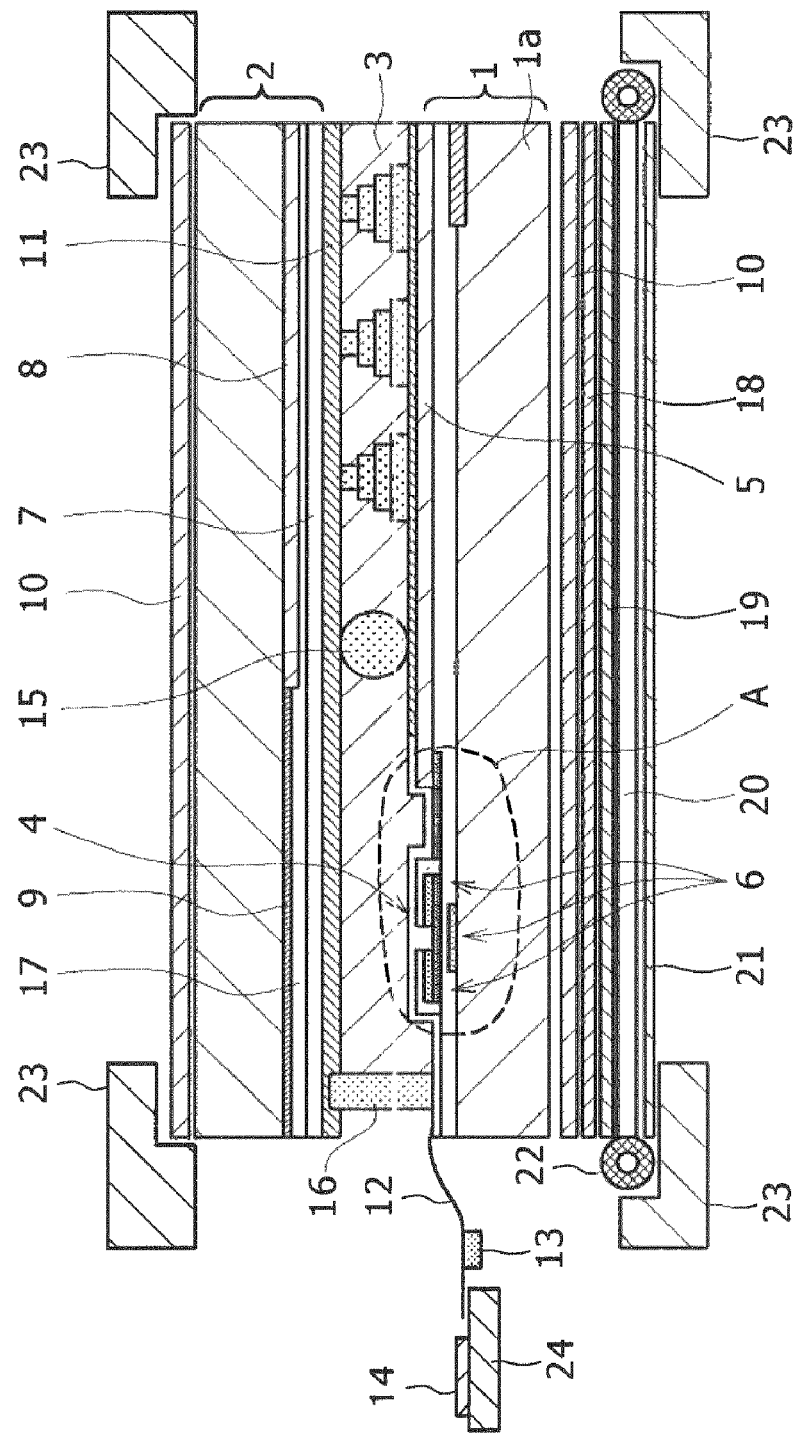
FIG. 1 is a typical sectional view of a liquid crystal display panel for a display according to the present invention.

| REFERENCE CHARACTERS | |
|---|---|
| 1: | TFT substrate (TFT array substrate) |
| 1a: | Glass substrate |
| 2: | Counter substrate (Counter electrode) |
| 3: | Liquid crystal layer |
| 4: | Thin-film transistor (TFT) |
| 5, 45: | Transparent conducting film (Pixel electrode, ITO film, IZO film |
| 6: | Wiring unit |
| 7: | Common electrode |
| 8: | Color filter |
| 9: | Shading film |
| 10: | Polarizer |
| 11: | Alignment film |
| 12: | TAB tape |
| 13: | Drive circuit |
| 14: | Control circuit |
| 15: | Spacer |
| 16: | Sealing material |

-continued

| REFERENCE CHARACTERS | |
|---|---|
| 17: | Protective film |
| 18: | Diffuser |
| 19: | Prism sheet |
| 20: | Light guide plate |
| 21: | Reflecting plate |
| 22: | Back light |
| 23: | Holding frame |
| 24: | Printed wiring board |
| 25: | Scanning line |
| 26: | Gate line (Gate electrode) |
| 27: | Gate insulating film |
| 28: | Source line (Source electrode) |
| 29: | Drain line (Drain electrode) |
| 30, 43: | Protective films (Layer insulating film, silicon nitride film) |
| 31: | Photoresist film |
| 32, 44: | Contact holes |
| 41: | Silicon wafer |
| 42: | Aluminum alloy layered wiring film |
| 42 (X): | First layer |
| 42 (Y): | Second layer |
| (X): | First layer |
| (Y): | Second layer |

BEST MODE FOR CARRYING OUT THE INVENTION

Displays in preferred embodiments according to the present invention will be described with reference to the accompanying drawings. It is to be understood that the present invention is not limited by the accompanying drawings and various changes and variations are possible without departing from the scope of the invention mentioned herein.

Figure 5:
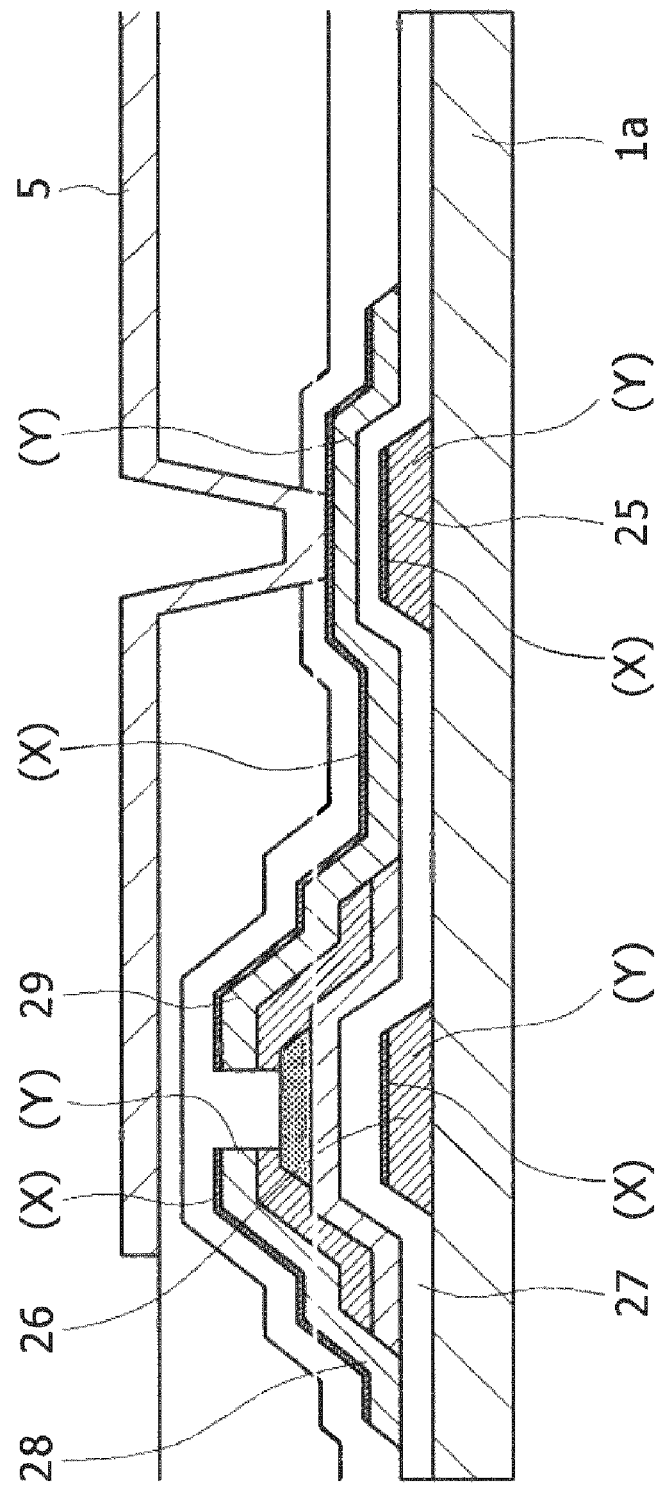
FIG. 5 is a typical sectional view of a thin-film transistor (TFT)

FIG. 5 is a typical sectional view of a thin-film transistor applied to an array substrate employed in the present invention. Most parts of the thin-film transistor shown in FIG. 5 are the same as those shown in FIG. 2 and hence the parts like or corresponding to those shown in FIG. 2 are designated by the same reference characters and the description thereof will be omitted to avoid duplication.

Figure 2:
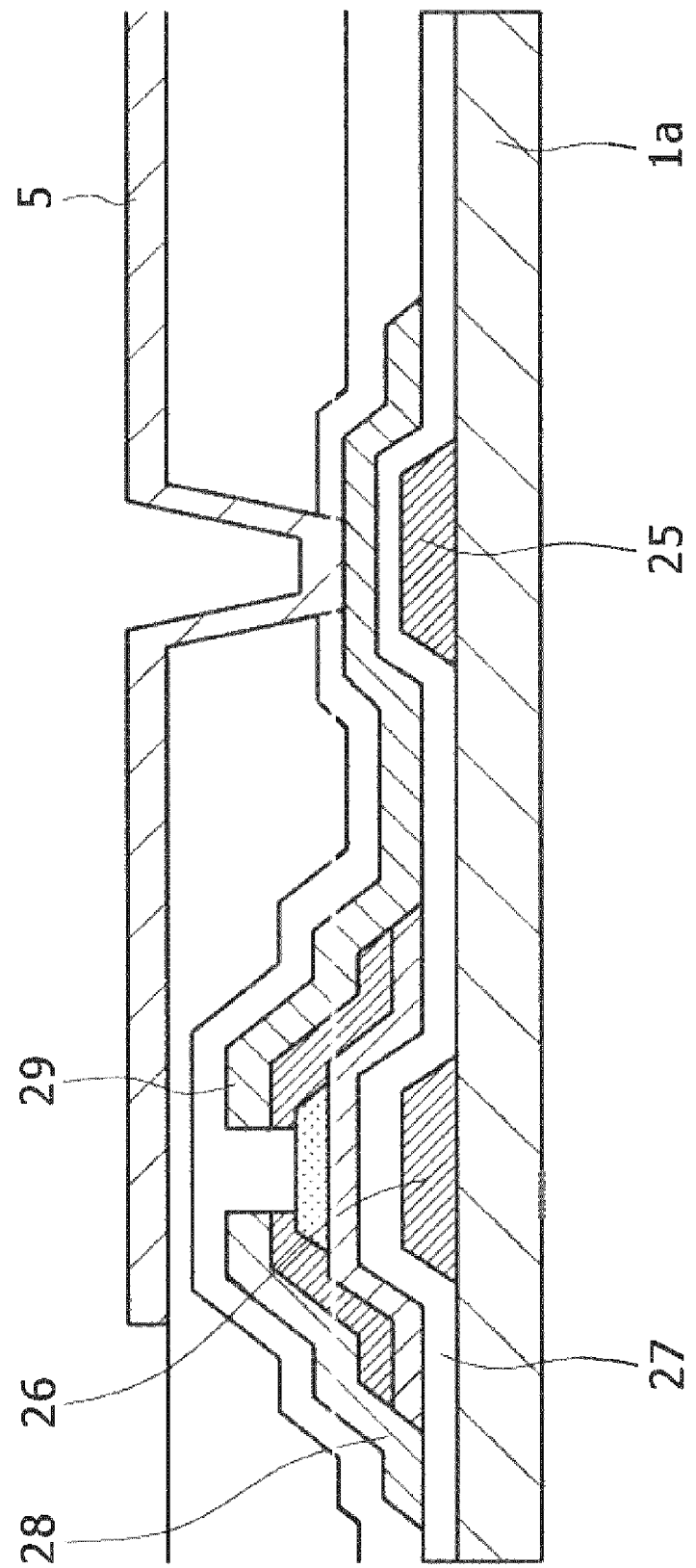
FIG. 2 is a typical sectional view of a generally known thin-film transistor (TFT)
Figure 3:
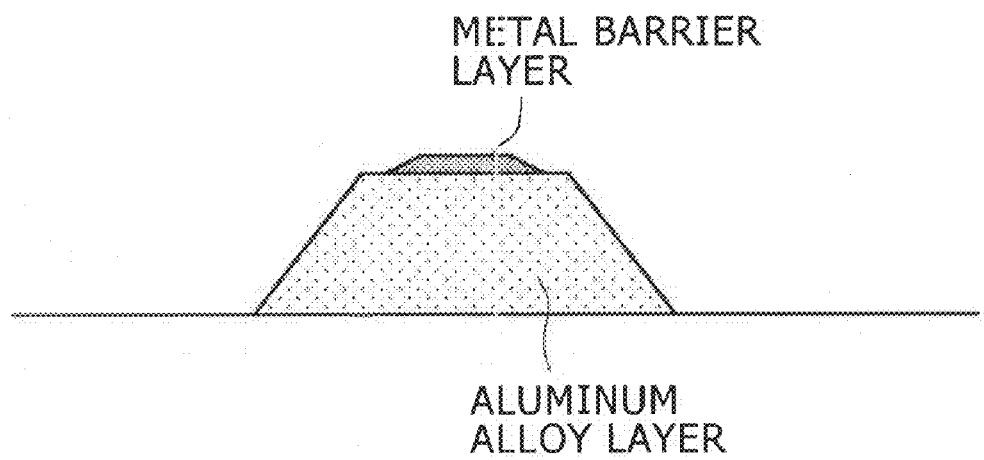
FIG. 3 is a typical sectional view of a wiring line formed by superposing metal layers which can be etched at greatly different etch rates, respectively.
Figure 4:
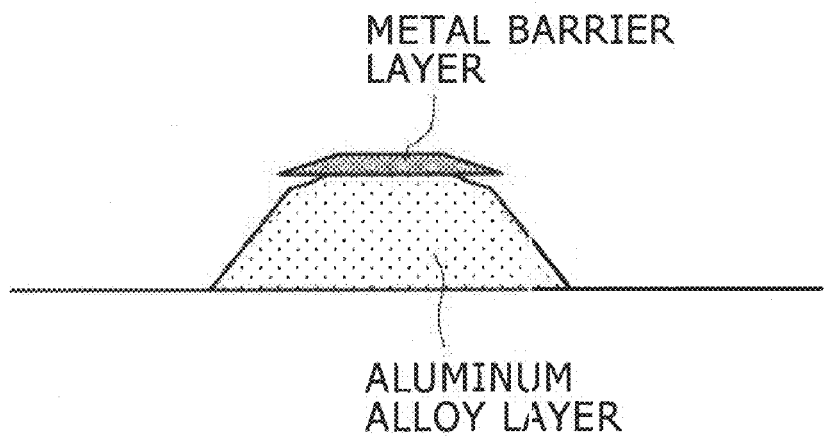
FIG. 4 is typical sectional view of a wiring film corroded by galvanic corrosion.

The thin-film transistor shown in FIG. 5 differs from that shown in FIG. 2 in that an aluminum alloy material forming each of a scanning line 25, a gate line 26 and source•drain lines 28 and 29 is a layered structure formed by superposing a first layer (X) of a special aluminum alloy and a second layer (Y) of pure aluminum or an aluminum alloy.

The aluminum alloy forming an aluminum alloy wiring film of the layered structure is excellent in heat resistance and capable of being in direct electrical contact with a transparent conducting film.

The wiring film is formed by superposing the first layer (X) of (i) an aluminum alloy containing at least one of elements including Ni, Ag, Zn and Cu of an element group Q in a content in the range of 0.1 to 6 at. %, and containing at least one of rare-earth elements including Mg, Mn, V, Pt, Cr, Ru, Rh, Pd, Ir, W, Ti, Zr, Nb, Hf, Ta, Sn and Fe of an element group R in a content in the range of 0.1 to 6 at. %, (ii) an aluminum alloy containing at least one of elements including Ni, Ag, Zn, Cu and Co of an element group Q' in a content in the range of 0.1 to 6 at. % and containing at least one of rare-earth elements including Mg, Mn, V, Pt, Cr, Ru, Rh, Pd, Ir, W, Ti, Zr, Nb, Hf, Ta, Sn and Fe of an element group R in a content in the range of 0.1 to 6 at. %, or (iii) an aluminum alloy containing at least one of elements including Ni, Ag, Zn, Cu and Co of an element group Q' in a content in the range of 0.1 to 6 at. %, and containing at least one of rare-earth elements including La (lanthanum), Gd, Y, Nd and Dy of an element group R1 and at least one of elements including Mg, Mn, V, Pt, Cr, Ru, Rh, Pd, Ir, W, Ti, Zr, Nb, Hf, Ta, Sn and Fe of an element group R2 in a total content in the range of 0.1 to 6 at. %, and the second layer (Y) of pure aluminum or an aluminum alloy containing aluminum as a principal component and having a resistivity lower than that of the aluminum alloy forming the fist layer (X). The wiring layer is a two-layer structure as shown in FIG. 5. The first layer (X) can be formed in direct contact with a transparent conducting film (pixel electrode) 5 by properly designing conditions for forming the gate electrode 26 and the drain electrode 29.

When the first layer (X) is formed of the foregoing aluminum alloy, the element or elements of the element group Q or Q' deposit in the interface between the aluminum alloy wiring film and the transparent conducting film, which reduces contact resistance.

Nickel (Ni), Ag and Cu are particularly preferable elements among those of the element groups Q or Q'. Only Ni, Ag or Cu may be contained in the aluminum alloy. Nickel (Ni) Ag, Ni and Cu or Ag and Cu may be contained in combination in the aluminum alloy. Ni deposit, Cu deposit and Ag deposit are deposited in the interface between the aluminum alloy wiring film and the transparent conducting film when two or more elements of the element group Q or Q' are contained in the aluminum alloy. Nickel (Ni) deposit, Cu deposit and Ag deposit reduces contact resistance between the aluminum alloy and the transparent conducting film. Thus, the respective effects of the elements of the element groups Q or Q' on reducing contact resistance do not cancel each other when some of the elements of the element group Q or Q' are added to the aluminum alloy in combination.

The present invention uses, for forming the first layer (X) of the wiring film, the aluminum alloy containing one or some of the elements of the element group Q or Q', namely, alloying elements effective in reducing contact resistance between the transparent conducting film and the aluminum alloy wiring film, in a content in the range of 0.1 to 6 at. % and one or some of the elements of the element group R, namely, alloying element effective in improving heat resistance, in a content in the range of 0.1 to 6 at. % The aluminum alloy wiring film having this first layer (X) is excellent in heat resistance (hillock resistance) and can be in direct contact with the transparent conducting film.

If the first layer (X) contains the element or elements of the element group Q or Q' in a content below 0.1 at. %, contact resistance between the transparent conducting film and the aluminum alloy wiring film cannot be effectively reduced and satisfactory conductivity cannot be achieved. If the first layer (X) contains the element or elements of the element group Q or Q' in a content above 6 at. %, residues are produced during etching for forming wiring lines, fine-processing is difficult and the wiring film has a high resistivity.

If the first layer (X) contains the element or elements of the element group R in a content below 0.1 at. %, heat resistance cannot be satisfactorily improved. If the first layer (X) contains the element or elements of the element group R in an excessively high content above 6 at. %, residues are produced during etching for forming wiring lines, fine-processing is difficult and the wiring film has a high resistivity. Rare-earth elements are particularly preferable elements among those of the element group R. Above all, Y, Nd, La, Gd and Dy are preferable elements. These elements may be individually used or La and Gd, Dy and La and Nd, and Y may be used in combination.

The aluminum layered wiring lines are exposed in some of processes for fabricating the TFT array substrate of the display. Therefore, there is an opportunity for the surface of the aluminum alloy wiring film to be exposed to various chemical solutions, such as a photoresist remover containing an amine, namely, an alkaline aminic remover. Damage caused by such a remover to the aluminum alloy layered wiring film is a serious problem because the damage remains in wiring lines formed by processing the aluminum alloy layered wiring film. Therefore, some conditions for manufacturing the display requires the aluminum alloy wiring film to have chemical resistance Among the elements of the element group R, Mg, Mn, V, Pt, Cr, Ru, Rh, Pd, Ir, W, Ti, Zr, Nb, Hf, Ta, Sn and Fe contribute to improving heat resistance as mentioned above and are effective in improving chemical resistance. Therefore, it is desirable that the aluminum alloy wiring film contains at least one of the elements of the rare-earth element group R1, preferably, at least one of La, Gd, Y, Nd and Dy, and at least one of the element of the element group R2, preferably, at least one of Cr, Ti, Z4, Nb and Ta, in addition to the element or elements of the element group Q' to ensure the improvement of both heat resistance and chemical resistance.

Chemical resistance against an aminic remover, namely, an alkaline solution, can be surely improved by using at least two elements of the element group R2, such as Nb and Ti.

Preferably, aluminum alloy wiring film contains the element or elements of the element group R2 in a content of 0.1 at. % or above.

It is desirable that the aluminum alloy wiring film contains the elements of the element groups R1 and R2 in a total content in the range of 0.1 to 6 at. %, in which (R1)>0% AT and (R2)>0 at. % If the total content, namely, the sum of (R1) content and (R2) content, is below 0.1 at. %, heat resistance cannot be satisfactorily improved and formation of hillocks cannot be satisfactorily prevented. If the total content is above 6 at. %, residues are produced during etching for forming wiring lines, fine-processing is difficult and the wiring film has a high resistivity. At least the two elements that can be used in combination among the elements of the rare-earth element group F1 are La and Gd, Dy and La or Nd and Y.

The specific materials of the first layer (X) and formation of the second layer (Y) made of pure aluminum or an aluminum alloy and having a resistivity lower than that of the first layer (X) under the first layer (X) are essential requisite conditions of the present invention. Such requisite conditions need to be satisfied to ensure that the wiring film has the lowest possible resistivity and a high conductivity.

To make the first layer (X) and the second layer (Y) exhibit their functions and effects more effectively, it is desirable that the first layer (X) of the aluminum alloy layered wiring film including those layers has a thickness of 20 nm or above. If the thickness of the first layer (X) is below 20 nm, the formation of hillocks resulting from heat history experienced by the aluminum alloy layered wiring film during the TFT manufacture process, namely, defective protrusions, in the second layer (Y) cannot be effectively suppressed and it is difficult to achieve heat resistance on a level intended by the present invention. From the viewpoint of ensuring satisfactory heat resistance, it is desirable that the thickness of the first layer (X) is at least 5% of the overall thickness of the aluminum alloy layered wiring film. Although there is no upper limit to the thickness of the first layer (X), the upper limit thickness of the first layer (X) may be determined taking electric resistance into consideration.

The present invention is characterized by the layered structure including the first layer (X) of a predetermined composition and the second layer (Y) and serving as an aluminum alloy wiring film in direct contact with the transparent conducting film. It is effective in providing the following characteristics to form the following third layer under the second layer (Y).

When the source•drain electrodes are formed by processing the aluminum alloy wiring film, it is necessary to suppress diffusion between the electrodes and a doped semiconductor layer. For example, if pure aluminum forming the second layer (Y) is brought into direct contact with a doped amorphous silicon layer, diffusion is liable to occur between pure aluminum and the doped amorphous silicon layer due to heat history that is experienced by the second layer (Y) during the manufacture of the TFT array substrate. Such diffusion deteriorates the characteristics of TFTs and is liable to deteriorate the display quality of the display. It has been a method of suppressing such diffusion to form a metal barrier layer of Mo or Cr. Problems arises when a metal barrier layer and wiring lines of pure aluminum or an aluminum alloy are superposed; that is, the electric resistance of the wiring lines increases, and it is difficult to achieve fine-processing for forming the wiring lines and to form wiring lines having a tapered sectional shape having a taper angle between 45° and 60° due to difference in etch rate between the different metals.

it is effective to form source•drain electrodes by a three-layer aluminum alloy layered structure of pure aluminum and an aluminum alloy by processing, for example, the surface of an amorphous silicon layer by a plasma nitriding process, forming an aluminum alloy layer according to the present invention having both heat resistance and conductivity, such as an aluminum alloy layer containing Al, 2 at. % Ni and 0.35 at. % La, as a third layer under the second layer (Y) to build an X/Y/X'/surface-nitrided amorphous silicon layer structure (X and X' are formed of the same or different aluminum alloys). A desirable composition and thickness of the third layer (X') are substantially the same as the first layer (X).

It is effective in providing the diffusion suppressing effect to form an aluminum alloy layer containing at least one of the elements of the element group R2 in 0.1 at. %, such as a layer of Al-2 at. % Ni-0.35 at. % La-1 at. % Nb, on the amorphous silicon layer so as to underlie the second layer (Y) as a third layer to build an X/Y/X'/amorphous silicon layer (X and X' are formed of the same or different aluminum alloys) and to form the source•drain electrodes of pure aluminum or an aluminum alloy in a three-layer structure. A preferable composition and thickness of the alloy forming the third layer (X') are basically the same as the first layer (X).

The first layer (X) and the third layer do not need to be the same in composition and thickness. The compositions and thicknesses of the first layer (X) and the third layer may be optimum compositions and optimum thicknesses chosen from the foregoing preferable compositions and thicknesses.

When the source•drain electrodes are formed in such wiring line construction, diffusion between the amorphous silicon layer and the source•drain electrodes can be suppressed, and aluminum electrodes having a low resistivity and capable of being processed by a fine-process can be formed.

Usually, the aluminum alloy wiring film of the layered construction is formed by a sputtering process. When the aluminum alloy wiring film is a two-layer structure, the second layer (Y) is formed first by sputtering, and then the first layer (X) is formed on the second layer (Y). When the aluminum alloy wiring film is a three-layer structure intended to provide the aluminum alloy wiring film with a diffusion suppressing effect, the third layer the second layer and the first layer may be formed in that order by sputtering. The aluminum alloy layered wiring film thus formed is subjected to a patterning process to form wiring lines desirably having a tapered sectional shape of a taper angle between 45° and 60° from the viewpoint of coverage.

After the aluminum alloy layered wiring film has been formed and pixel electrodes have been formed by processing the transparent conducting film, the workpiece is subjected to a heating process at a temperature between 150° C. and 400° C. Consequently, part or all of the alloying elements dissolved in a unequlibrated state in the first layer (X) of the aluminum alloy layered wiring film are produced in deposits and intermetallic compounds to form a concentrated layer in the interface between the aluminum alloy layered wiring film and the transparent conducting film. Thus, a conducting contact of a low resistivity can be realized. The first layer (X) serves also as a protective layer for the second layer (Y) and prevents the formation of hillocks.

A manufacturing process for manufacturing the TFT array substrate 1 shown in FIG. 5 will be briefly described with reference to FIGS. 6 to 12. The thin-film transistors, namely, switching elements, are amorphous silicon TFTs using a semiconductor layer of hydrogenated amorphous silicon.

Figure 6:
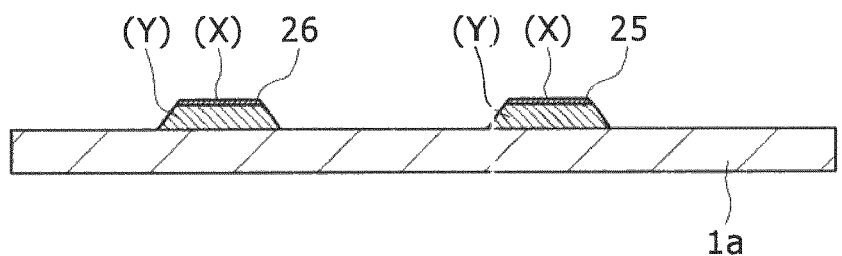
FIG. 6 is a typical sectional view of assistance in explaining a step of manufacturing a TFT array substrate of a first embodiment of the present invention.

A pure aluminum thin film of a thickness on the order of 200 nm is formed as a second layer (Y) by a sputtering process or the like. Then, an aluminum alloy film of a thickness n the order of 100 nm containing, for example, Al, 2 at. % Ni and 0.35 at. % La and capable of being in direct contact with the transparent conducting film is formed as a first layer (X) on the second layer (Y) by a sputtering process or the like. An aluminum alloy layered wiring film thus formed is subjected to a patterning process to form gate electrodes 26 and scanning lines 25 as shown in FIG. 6. To form a gate insulating film, which will be described later, in a satisfactory coverage, it is preferable to etch the aluminum alloy layered wiring film such that side surfaces of wiring lines are tapered at a taper angle between 45° and 60°.

Figure 7:
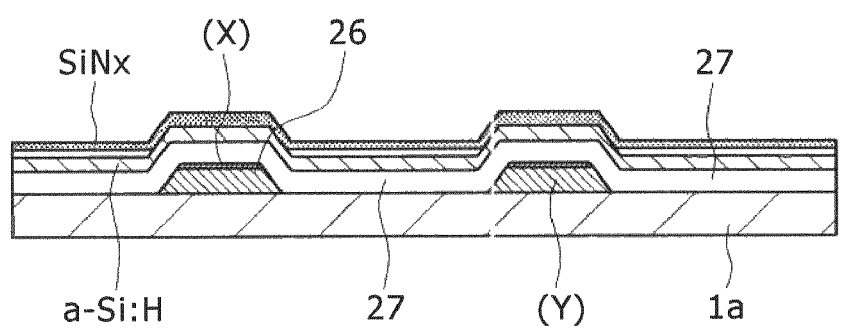
FIG. 7 is a typical sectional view of assistance in explaining a step of manufacturing the TFT array substrate in the first embodiment.

Then, as shown in FIG. 7, a gate insulating film (SiO, film) 27 having a thickness of, for example, about 300 nm is formed by, for example, a plasma CVD process, a hydrogenated amorphous silicon film (a-Si:H film) having a thickness of, for example, 50 nm and a silicon nitride film ($SiN_x$ film) having a thickness of about 300 nm are formed.

Figure 8:
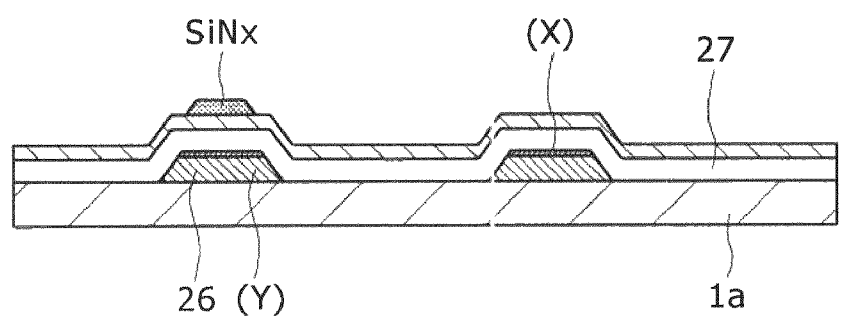
FIG. 8 is a typical sectional view of assistance in explaining a step of manufacturing the TFT array substrate in the first embodiment.
Figure 9:
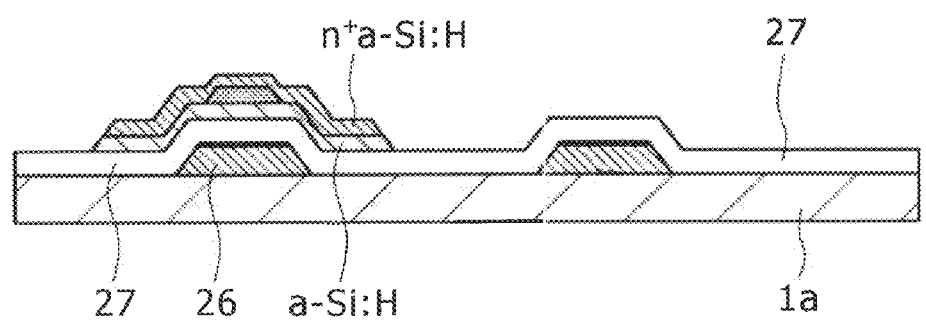
FIG. 9 is a typical sectional view of assistance in explaining a step of manufacturing the TFT array substrate in the first embodiment.

Subsequently, the silicon nitride film ($SiN_x$ film) is patterned as shown in FIG. 8 by back exposure using the gate electrode 26 as a mask to form a channel-protecting film. Then, a phosphorous-doped $n^+$ type hydrogenated amorphous silicon film ($n^+$ a-Si:H film) having a thickness of, for example, about 50 nm is formed thereon. Then, the hydrogenated amorphous silicon film (a-Si:H film) and the $n^+$ type hydrogenated amorphous silicon film ($n^+$ a-Si:H film) are patterned as shown in FIG. 9.

Figure 10:
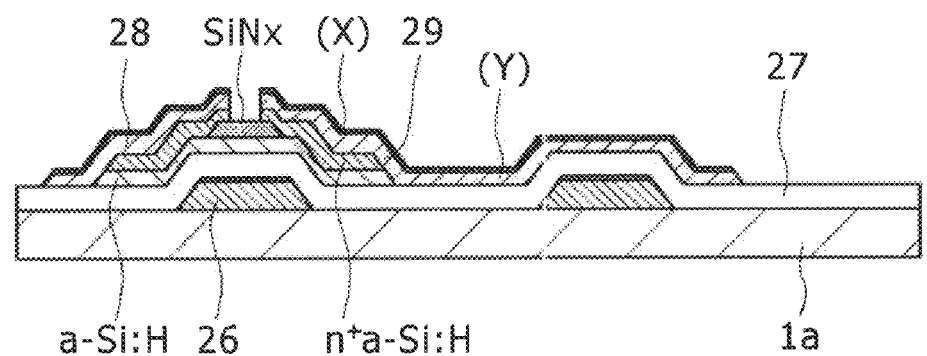
FIG. 10 is a typical sectional view of assistance in explaining a step of manufacturing the TFT array substrate in the first embodiment.

Then, a second layer (Y), namely, a pure aluminum thin film, having a thickness, for example, on the order of 150 nm is formed by a sputtering process or the like. Then, a first layer (X) containing, for example, Al, 2 at. % Ni and 0.35 at. % La and capable of being indirect contact with a transparent conducting film is formed on the second layer (Y) by a sputtering process or the like to form an aluminum alloy layered wiring film. Then, as shown in FIG. 10, the aluminum alloy layered wiring film is patterned to form source electrodes 28 combined with signal lines, and drain electrodes 29 to be brought into contact with a transparent conducting film (pixel electrodes) 5. Parts of the $n^+$ type hydrogenated amorphous silicon film ($n^+$ a-Si:H film) on the channel-protecting film ($SiN_x$ film) using the source electrodes 28 and the drain electrodes 29.

Figure 11:
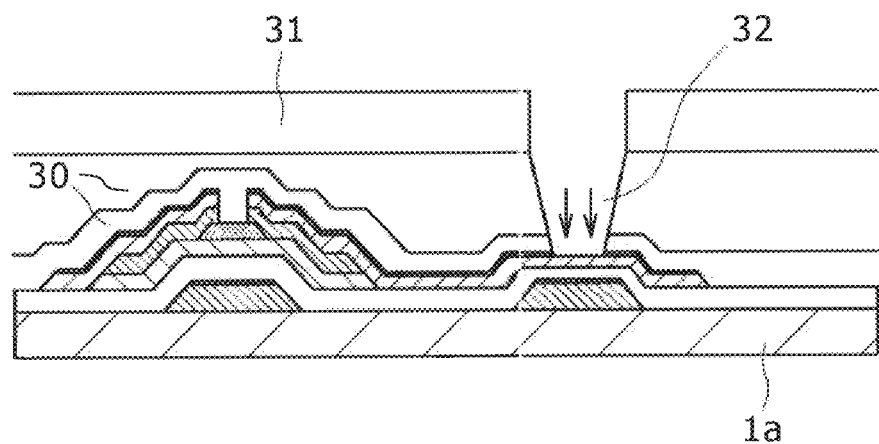
FIG. 11 is a typical sectional view of assistance in explaining a step of manufacturing the TFT array substrate in the first embodiment.

As shown n FIG. 11, a silicon nitride film 30, namely, a protective film, having a thickness on the order of 300 nm is formed by, for example, a plasma CVD system using, for example, a process temperature on the order of 300° C. A photoresist film 31 is formed on the silicon nitride film 30, and then the silicon nitride film 30 is patterned, and contact holes 32 are formed in the silicon nitride film 30 by, for example, dry etching. After the completion of etching the silicon nitride film 30, an overetching process is carried out for about a time equal to the sum of a time for etching the silicon nitride film and 100% to etch the surface of the aluminum alloy layered wiring film by a depth of about 10 nm.

Figure 12:
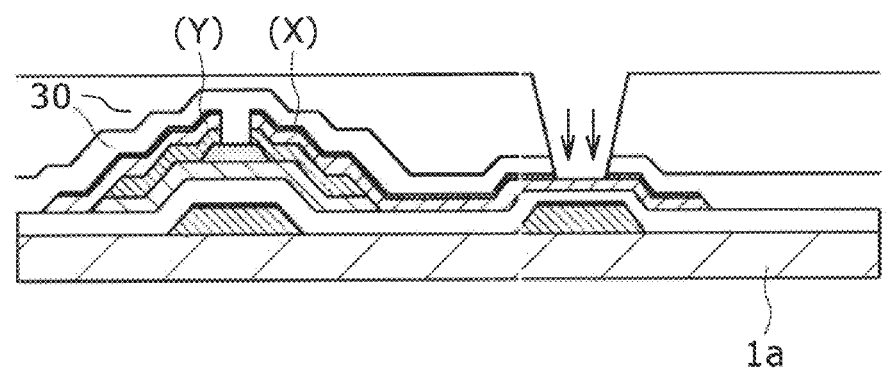
FIG. 12 is a typical sectional view of assistance in explaining a step of manufacturing the TFT array substrate in the first embodiment.
Figure 13:
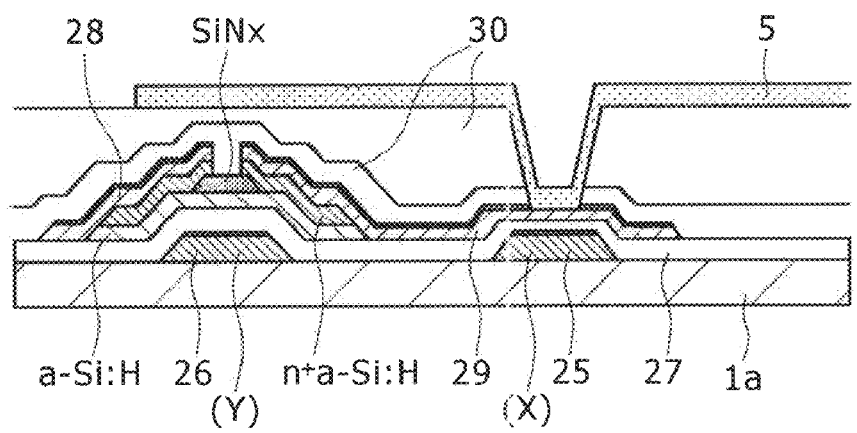
FIG. 13 is a typical sectional view of assistance in explaining a step of manufacturing the TFT array substrate in the first embodiment.

As shown in FIG. 12, an ashing process using an oxygen plasma is executed, and a photoresist removing process using, for example, a remover, such as an amine remover, is executed to remove the photoresist film 31. Then, as shown in FIG. 13, a transparent conducting film (ITO or IZO film) of a thickness on the order of 40 nm is formed, the transparent conducting film is patterned to form a transparent conducting film (pixel electrodes) 5. Thus, a TFT array substrate is completed.

In the TFT array substrate thus fabricated, the transparent conducting film (pixel electrodes) 5 and the drain electrodes 29 formed by processing the aluminum alloy layered wiring film are in direct contact with each other, and the aluminum alloy layered wiring film, namely, a layered film having the first layer (X) and the second layer (Y), and the amorphous silicon are in direct contact with each other as shown in FIG. 5.

Contact resistance between the transparent conducting film and the aluminum alloy layered wiring film in direct contact with the transparent conducting film can be suppressed by producing deposits including the additive elements or by producing an intermetallic compounds of dissolved elements including aluminum in boundaries of aluminum gains, extending the etching process for forming the contact holes by an over etching time to disperse part of the deposited additive elements or the intermetallic compounds in the surface of the aluminum alloy layered wiring film by:

(A) heating the first layer (X), namely, the aluminum alloy film, in forming the first layer (X) on the second layer (Y), namely, a pure aluminum or an aluminum alloy film or (B) heating the wiring film before subjecting the wiring film to a contact hole forming etching process.

The construction of a thin-film transistor for a second embodiment of the present invention will be described.

Figure 14:
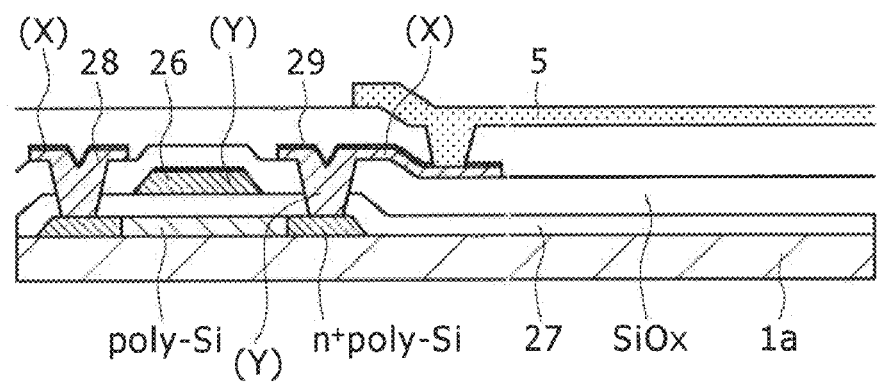
FIG. 14 is a typical sectional view of assistance in explaining a step of manufacturing a thin-film transistor (TFT) array substrate in a second embodiment according to the present invention.

FIG. 14 is an enlarged, schematic, typical sectional view of a thin-film transistor for the second embodiment included in an array substrate of the present invention, in which parts like or corresponding to those shown in FIGS. 5 to 13 are designated by the same reference characters. The thin-film transistor is a top gate type thin-film transistor.

Referring to FIG. 14, scanning lines are formed by an aluminum alloy layered wiring film similar to that shown in FIG. 5, namely, a layered film including a first layer (X) of a specific aluminum alloy and a second layer (Y) of pure aluminum or a specific aluminum alloy, are formed on a glass substrate 1a. Part of the scanning line serves as a gate electrode 26 for switching ON-OFF the thin-film transistor. Signal lines of the aluminum alloy layered wiring film are extended so as to intersect the scanning lines and are isolated form the scanning lines by a layer insulating film ($SiO_x$ film). Part of the signal line serves as a source electrode of the thin-film transistor.

A transparent conducting film (pixels) 5, namely, an ITO film of $In_2O_3$ containing SnO or an IZO film of $In_2O_3$ containing ZnO, is formed in pixel areas on the layer insulating film ($SiO_x$ film). Drain electrodes 29 formed from the aluminum alloy layered wiring film of the thin-film transistors function as connecting electrodes electrically connected to the transparent conducting film (pixel electrodes) 5. The drain electrodes 29 of the thin-film transistors formed from the aluminum alloy layered wiring film are in direct contact with and electrically connected to the transparent conducting film (pixel electrodes) 5.

Similarly to the example shown in FIG. 5, the thin-film transistor on the TFT array substrate is turned on when a gate voltage is applied through the scanning line to the gate electrode 26. Consequently, a predetermined drive voltage applied beforehand to the signal line is applied from the source electrode 28 through the drain electrode 29 to the transparent conducting film (the pixel electrode) 5. Then, a potential difference is produced between the counter electrode 2 and the transparent conducting film (the pixel electrode) 5 and the liquid crystal molecules of the liquid crystal layer 3 are aligned for light modulation.

A method of fabricating the TFT array substrate shown in FIG. 14 will be described. The thin-film transistors of the TFT array substrate have to gate construction including a polysilicon film (poly-Si film) as a semiconductor layer. FIGS. 15 to 21 are schematic views of assistance in explaining steps of a method of fabricating the TFT array substrate in the second embodiment.

Figure 15:
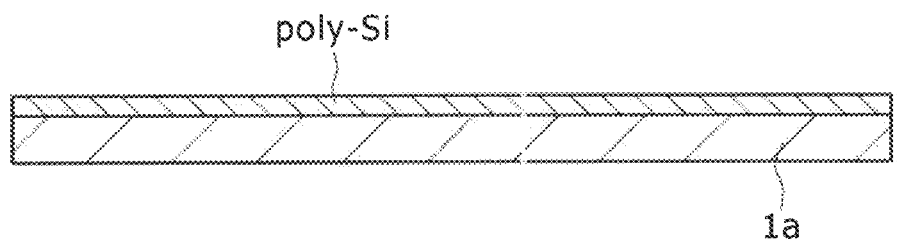
FIG. 15 is a typical sectional view of assistance in explaining a step of manufacturing the TFT array substrate in the second embodiment.

A silicon nitride film ($SiN_x$ film) having a thickness on the order of 50 nm, a silicon oxide film ($SiO_x$ film) having a thickness on the order of 100 nm, and a hydrogenated amorphous silicon film (a-Si:H film) having a thickness on the order of 50 nm are formed on a glass substrate 1a heated at, for example, about 300° C. The Glass substrate 1a is subjected to a heating process and a laser annealing process to convert the hydrogenated amorphous silicon film (a-Si:H film) into a polysilicon film. The heating process heats the glass substrate 1a, for example, at about 470° C. for about 1 h for dehydrogenation. Then, the hydrogenated amorphous silicon film (a-Si:H film) is irradiated with a laser beam having, for example, an energy density of about 230 $mJ/cm^2$ by, for example, an eximer laser annealing device to form a polysilicon film (poly-Si film) having a thickness, for example, on the order of 0.3 μm as shown in FIG. 15.

Figure 16:
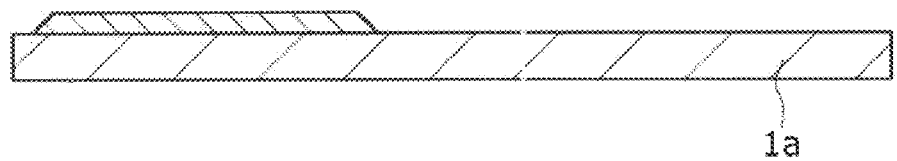
FIG. 16 is a typical sectional view of assistance in explaining a step of manufacturing the TFT array substrate in the second embodiment.
Figure 17:
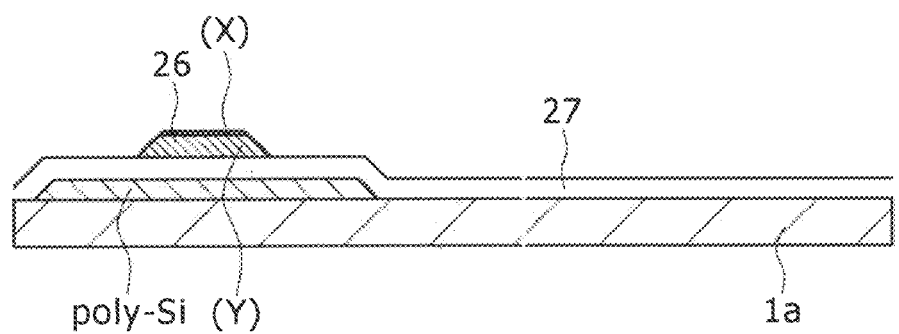
FIG. 17 is a typical sectional view of assistance in explaining a step of manufacturing the TFT array substrate in the second embodiment.

Then, the polysilicon film (poly-Si film) is patterned by plasma etching or the like as shown in FIG. 16. Then, a silicon oxide film ($SiO_x$ film) having, for example, a thickness on the order of 100 nm as shown in FIG. 17 is formed. This silicon oxide film serves as a gate insulating film 27. An aluminum alloy layered wiring film of a thickness on the order of 200 nm for forming scanning lines and gate electrodes 26 combined with the scanning lines is formed on the gate insulating film 27 by, for example, sputtering or the like. This aluminum alloy layered wiring film, similarly to that shown in FIG. 6, is a layered structure including, for example, a second layer (Y), namely, a pure aluminum thin film, and a first layer (X) formed on the second layer (Y) and having excellent heat resistance and conductivity. Then, the layered wiring film is patterned by a plasma etching process or the like to form gate electrodes 26 combined with scanning lines.

Figure 18:
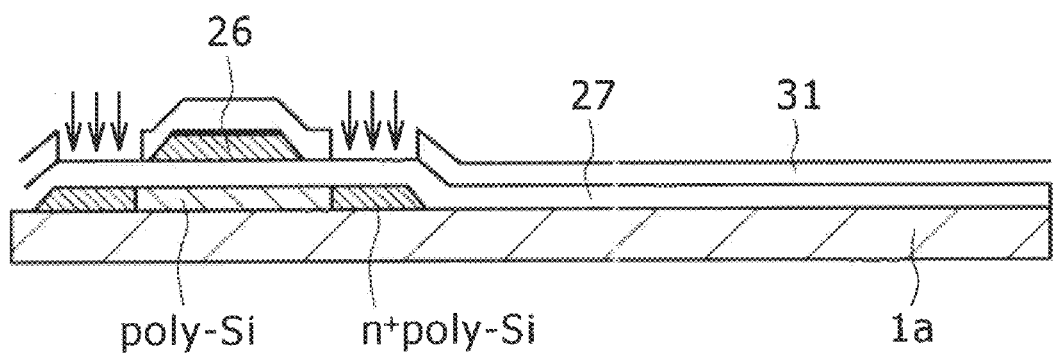
FIG. 18 is a typical sectional view of assistance in explaining a step of manufacturing the TFT array substrate in the second embodiment.

Then, as shown in FIG. 18, a photoresist film 31 is formed as a mask, phosphorous ions of about 50 keV are implanted in the polysilicon film (poly-Si film) in a dose f $10^{15}/cm^2$ to form $n^+$-type polysilicon films ($n^+$ poly-Si films) in parts of the polysilicon film (poly-Si film). Then the photoresist film 31 is removed and the glass substrate 1a is heated at a temperature, for example, on the order of 500° C. to diffuse the phosphorous ions.

Figure 19:
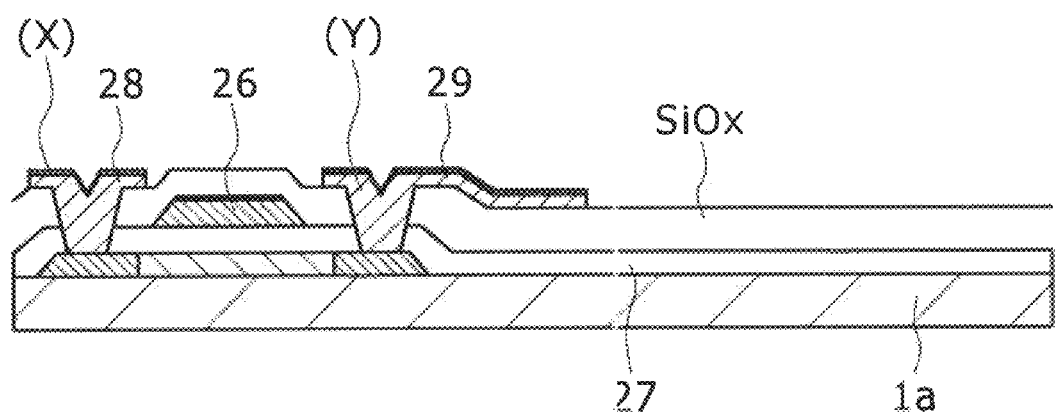
FIG. 19 is a typical sectional view of assistance in explaining a step of manufacturing the TFT array substrate in the second embodiment.

Then, as shown in FIG. 19, a silicon oxide film ($SiO_x$ film) of a thickness, for example, on the order of 500 nm is formed while the glass substrate 1a is heated at a temperature on the order of 300° C. This silicon oxide film is used as a layer insulating film. Similarly, a photoresist film is patterned and the layer insulating film ($SiO_x$ film) and the gate insulating film 27, namely, the silicon oxide films, are etched to form contact holes. An aluminum alloy layered wiring film of a thickness on the order of 450 nm is formed, similarly to that mentioned above, by forming a second layer (Y) of, for example, pure aluminum, and forming a first layer (X) having excellent heat resistance and conductivity on the second layer (Y). The aluminum alloy layered wiring film is patterned to form source electrodes 28 and drain electrodes 29 combined with signal lines. The source electrodes 28 and the drain electrodes 29 are connected by $n^+$-type polysilicon ($n^+$ poly-Si) formed in the contact holes.

Figure 20:
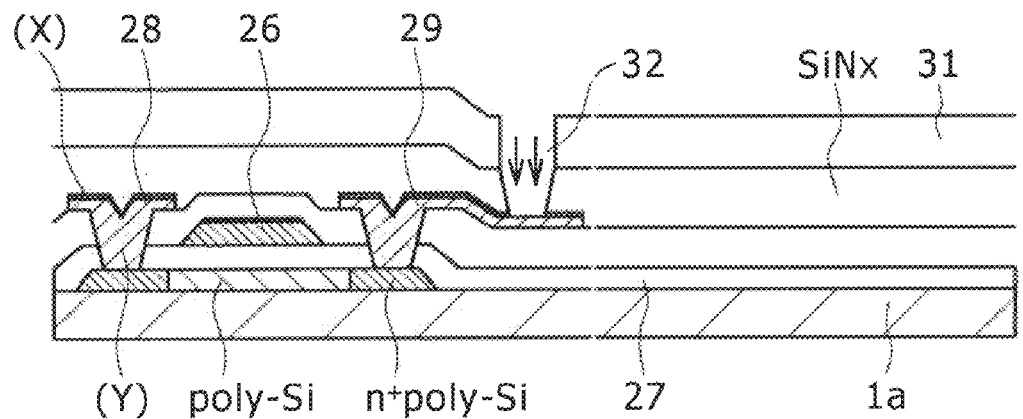
FIG. 20 is a typical sectional view of assistance in explaining a step of manufacturing the TFT array substrate in the second embodiment.

Then, as shown in FIG. 20, the glass substrate 1a is heated at a temperature on the order of 300° C. and a silicon nitride film ($SiN_x$ film), namely, a protective film, is formed in a thickness on the order of 500 nm by a plasma CVD system or the like. Then a photoresist film 31 is formed on the silicon nitride film ($SiN_x$ film), the silicon nitride film ($SiN_x$ film) is patterned, contact holes 32 are formed in the silicon nitride film ($SiN_x$ film) by, for example, dry etching, and then an overetching process is carried out for about a time equal to the sum of a time for etching the silicon nitride film and 100% to etch the surface of the aluminum alloy layered wiring film by a depth on the order of 10 nm.

Figure 21:
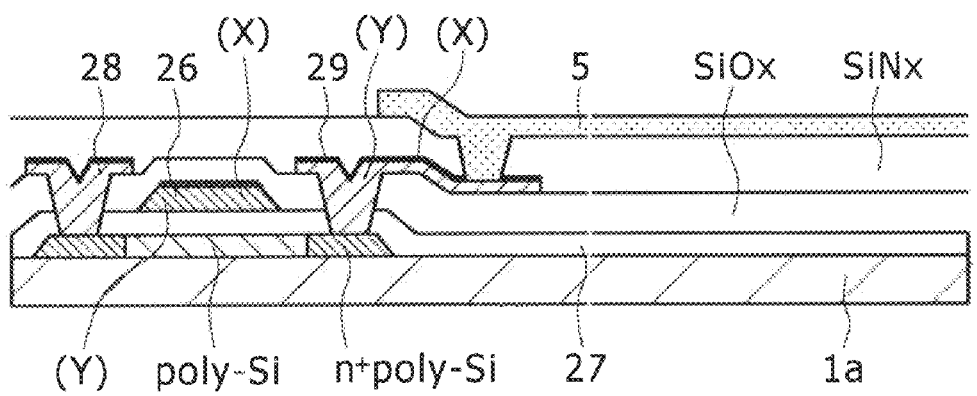
FIG. 21 is a typical sectional view of assistance in explaining a step of manufacturing the TFT array substrate in the second embodiment.

Then, as shown in FIG. 21, an ashing process using an oxygen plasma is executed, and a photoresist removing process using, for example, an amine remover is executed to remove the photoresist film 31. Then, an ITO or IZO film of a thickness on the order of 100 nm is formed by, for example, sputtering. A patterning process is carried out in a chamber in which the ITO or IZO film is formed to form a transparent conducting film (pixel electrodes) 5. Thus, the drain electrodes 29 are brought into direct contact with the transparent conducting film (pixel electrodes) 5.

Then, the workpiece is subjected to an annealing process at a temperature on the order of 350° C. for about 1 h to complete the polysilicon TFT array substrate in the second embodiment.

The TFT array substrate in the second embodiment and a liquid crystal display provided with this TFT array substrate have the same effects as the first embodiment.

It is desirable to produce part or all of the alloying elements dissolved in a unequlibrated state in the first layer (X) of the aluminum alloy layered wiring film in deposits, intermetallic compounds or a concentrated layer.

Vapor deposition processes and sputtering processes are possible methods of forming the aluminum alloy layered wiring film. Above all, a sputtering process is particularly preferable.

When the surface of the aluminum alloy layered wiring film is etched lightly as mentioned in Patent document 4 to disperse and deposit part or all of the alloying elements dissolved in a unequlibrated state in the first layer (X) of the aluminum alloy layered wiring film in deposits or intermetallic compounds after forming contact holes by etching in an insulating film formed on the aluminum alloy layered wiring film, contact resistance between the aluminum alloy layered wiring film and the transparent conducting film formed on the aluminum alloy layered wiring film can be further reduced.

A liquid crystal display, namely, a flat display as shown in FIG. 1, provided with the TFT array substrate is completed.

For example, a polyimide film is formed on the surface of the TFT array substrate shown in FIG. 5 or 15, the polyimide film is dried, and then, the dried polyimide film is subjected to a rubbing process to form an alignment film.

A counter substrate 2 as shown in FIG. 1 is formed by forming a shading film 9 by patterning, for example, a chromium film formed on a glass substrate in a matrix, forming a color filter 8 by filling up pores in the shading film 9 with red, blue and green resins, and forming a transparent conducting film of ITO as a common electrode 7 on the shading film 9 and the color filter 8. A polyimide film is formed on the surface of the counter substrate 2, the polyimide film is dried and the polyimide film is subjected to a rubbing process to form an alignment film 11.

The TFT array substrate 1 and the counter substrate 2 are disposed opposite to each other with the alignment film 11 facing the TFT array substrate 1. The two substrates are bonded together by a sealing material, such as a resin, such that a liquid crystal inlet is formed. A spacer 15 is placed between the two substrates to define a gap of a substantially fixed thickness between the two substrates.

An empty cell thus formed is placed in a vacuum space, the liquid crystal inlet is immersed in a liquid crystal and the pressure in the vacuum space is increased gradually to the atmospheric pressure. Thus the empty cell is filled up by a liquid crystal layer containing liquid crystal molecules, and then the liquid crystal inlet is sealed. Polarizers 10 are attached to the opposite outer surfaces of the cell to complete a liquid crystal display panel.

As shown in FIG. 1, a drive circuit for driving the liquid crystal display is electrically connected to the liquid crystal display panel and is disposed on a side surface or a back surface of the liquid crystal display panel. A frame having an opening defining a display surface of the liquid crystal display panel, a back light 22, namely, a surface light source, a light guide 20 and a holding frame 23 are attached to the liquid crystal panel to complete the liquid crystal display.

Example 1

An example of the aluminum alloy layered wiring film of the TFT array substrate will be described. Table 1 shows measured data on resistivity, contact resistance between the transparent conducting film and the aluminum alloy layered wiring film, heat resistance and fine-processability of the aluminum alloy layered wiring film.

Experimental conditions are as follows.

1) The second layer (Y) was formed of pure aluminum. The first layer (X) was formed of an aluminum alloy excellent in heat resistance, capable of being in direct contact with the transparent conducting film and containing at least one of the elements of the element group Q or Q' in a predetermined content. A layered film including the first layer (X) and the second layer (Y) was formed by sputtering processes. The layered film, namely, the wiring film, had an overall thickness of about 300 nm.

A sputtering system used for forming the layered film was HMS-552 (Shimadzu Corporation). A layered wiring film including a pure aluminum film of about 100 nm in thickness and an aluminum alloy film of about 300 nm in thickness was formed by a dc magnetron sputtering process on each of glass substrates (#1737, Corning Incorporated) of 50.8 mm in diameter and 0.7 mm in thickness for resistivity and heat resistance tests, and of 101.6 mm in diameter and 0.7 mm in thickness for a contact resistance test). Conditions for the dc magnetron sputtering process were back pressure: $0.27\times10^{-3}$ Pa or below, Ar gas pressure: 0.27 Pa, Ar gas flow rate: 30 sccm, sputtering power: dc 260 W, electrode distance: 50.4 mm and substrate temperature: room temperature.

2) Composition of the aluminum alloy forming the first layer (X) is shown in Table 1.

3) Measurement of resistivity: Each of the aluminum alloy layered wiring films was processed by photolithography and wet-etching to form a pattern for resistivity measurement. The resistivity was measured by a dc four-probe method after heating the aluminum alloy layered wiring film at 350° C. for 1 h. Wiring lines having a resistivity above 4.5 μΩ·cm were graded unacceptable and were marked with a cross, wiring lines having a resistivity equal to or below 4.5 μΩ·cm were graded acceptable and were marked with a circle and wiring lines having a resistivity equal to or below 4.0 μΩ·cm were graded excellent and were marked with a double circle.

Figure 22:
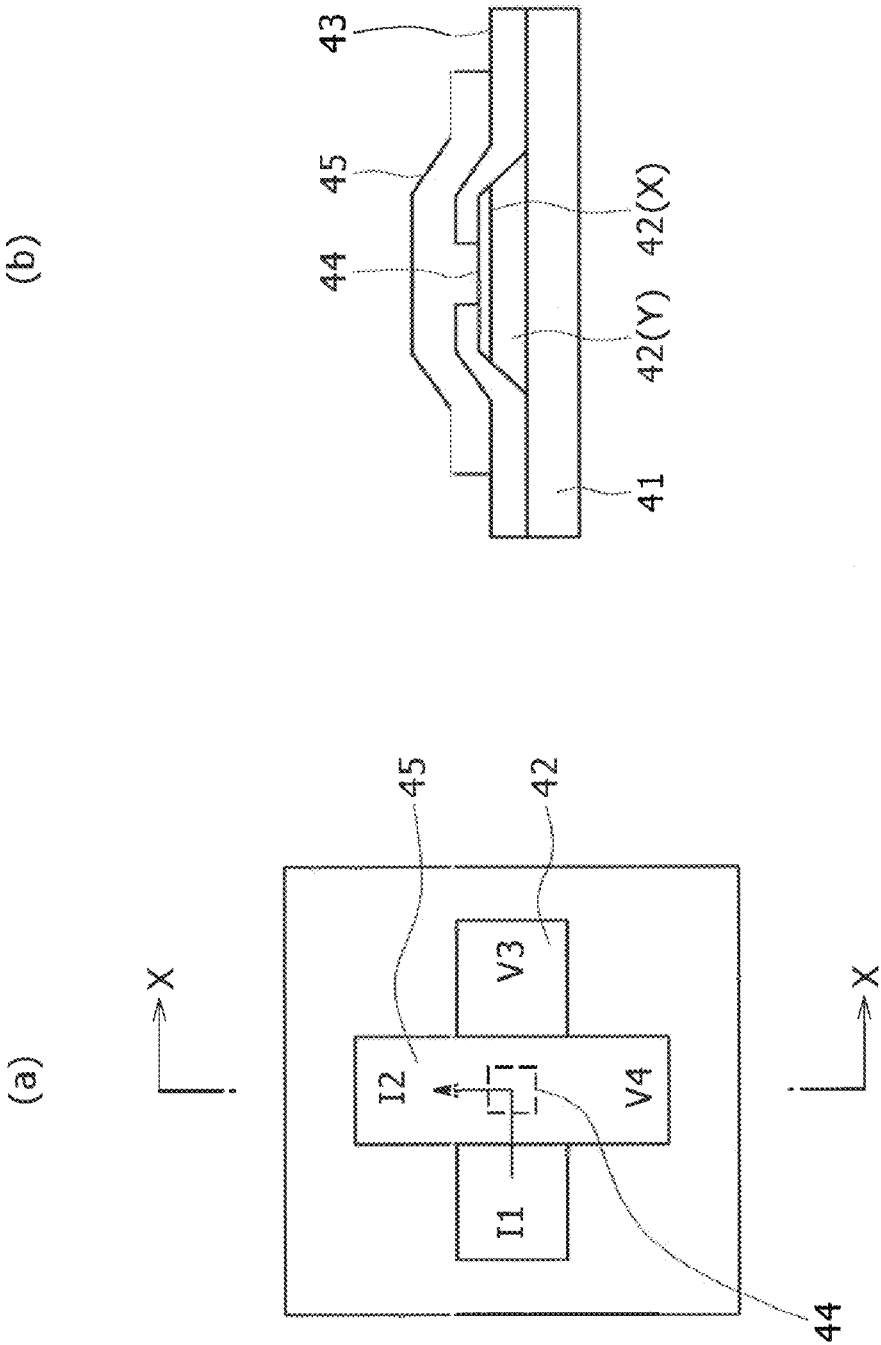
FIG. 22(a) is a view of a Kelvin pattern used for measuring resistivity and FIG. 22(b) is a sectional view taken on the line X-X in FIG. 22(a)

4) Measurement of contact resistance with transparent conducting film (ITO): A Kelvin pattern as shown in FIG. 22(a) was formed by the following method for contact resistance measurement. FIG. 22(b) is a sectional view taken on the line X-X in FIG. 22(a). As shown in FIG. 22(b), a silicon wafer 41 coated with an oxide film, namely, a $SiO_x$ film of 400 nm in thickness for insulation was used instead of a glass substrate. A second layer 42 (Y) of a thickness on the order of 200 nm, namely, a pure aluminum thin film, was formed by a sputtering process and a first layer 42 (X) of a thickness on the order of 100 nm was formed by a sputtering process on the first layer 42 (Y) to form a layered film of 300 nm in thickness. The layered film was patterned. Then, a layer insulating film ($SiN_x$ film) 43 of 300 nm in thickness was formed by a CVD process. A workpiece thus processed was subjected to a heating process for 1 h in a vacuum film forming chamber. A pattern of a 10 μm sq. contact hole was formed by photolithography. A contact hole 44 was formed by subjecting the workpiece processed by an etching process using a fluorine plasma by a RIE system (reactive ion etching system) (Samco Incorporated). The etching time for etching the layer insulating film was extended to carry out an overetching process for a time of 100%. The surface of the aluminum alloy layered wiring line was etched off by a depth of about 10 nm by the overetching process.

Then, the workpiece was subjected to oxygen plasma ashing and resist film removal using a resist remover. Remover TOK106 (Tokyo Ohka Kogyo Co., Ltd.) was used as the resist remover and the workpiece was cleaned at 70° C. for 10 min. A surface layer of several nanometers in thickness of the aluminum alloy layered wiring film was removed to remove contaminants including fluorides, oxides and carbon. An indium tin oxide film (ITO film) of 200 nm in thickness of indium oxide containing 10% by mass tin oxide was formed by sputtering as a transparent conducting film 45 for forming pixel electrodes. Oxygen was added to the a film forming atmosphere to form the indium tin oxide film. ITO film forming conditions were $Ar/O_2$=30 sccm/0.2 sccm, gas pressure: 2 mTorr, and sputtering power: dc 150 W. An ITO film having a resistivity on the order of $2\times10^{-4}$ Ω·cm was formed by sputtering. The ITO film, namely, the transparent conducting film 45, was patterned to form pixel electrodes.

A four-terminal manual prober and a semiconductor parameter analyzer (HP4156A, Hewlett-Packard Co.) were used for contact resistance measurement. In the contact resistance measurement, a current was passed through a terminal 11 of the aluminum alloy layered wiring film 42 (FIG. 22(a)) and a terminal 12 of the ITO film 45 (FIG. 22(a) and voltages V3 and V4 (FIG. 22(a)) between other terminals were measured. Potential difference ΔV (=V3−V4) between the two terminals was determined, and contact resistance R was calculated by using: R=ΔV/I2. This method can determine the pure resistivity (contact resistance) of the joint of the ITO film and the aluminum alloy layered wiring film, eliminating the resistance of the wiring line.

A contact resistance equal to or below 200Ω was graded acceptable and was marked with a double circle, a contact resistance above 200Ω and not higher than 500Ω was graded fair and was marked with a circle, and a contact resistance above 500Ω was graded unacceptable and was marked with a cross.

5) Heat resistance test: A wiring pattern was formed by processing the aluminum alloy layered wiring film by a photolithographic wet etching process to examine the heat resistance of the aluminum alloy layered wiring film. Then, the aluminum alloy layered wiring film was processed by a heating process at 350° C. for 1 h. Then, the surface of the heated aluminum alloy layered wiring film was observed under an optical microscope to count hillocks formed in the surface. The aluminum alloy layered wiring film having hillocks in a density below $10^9/m^2$ was graded acceptable and was marked with a circle and the aluminum alloy layered wiring film having hillocks in a density not lower than $10^9/m^2$ was graded unacceptable and was marked with a cross.

Figure 23:
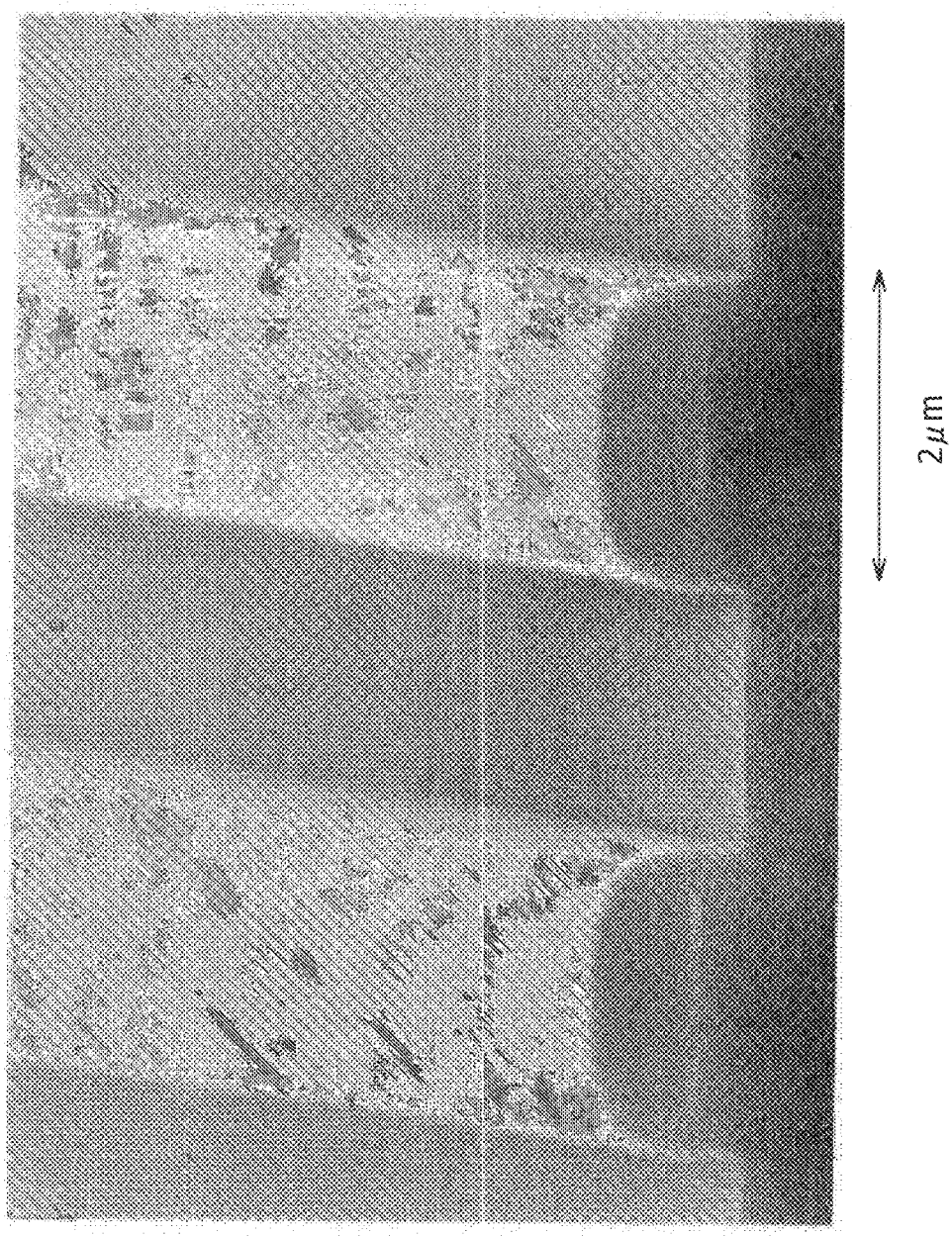
FIG. 23 is a photograph of an aluminum alloy layered wiring line taken under a SEM.
Figure 24:
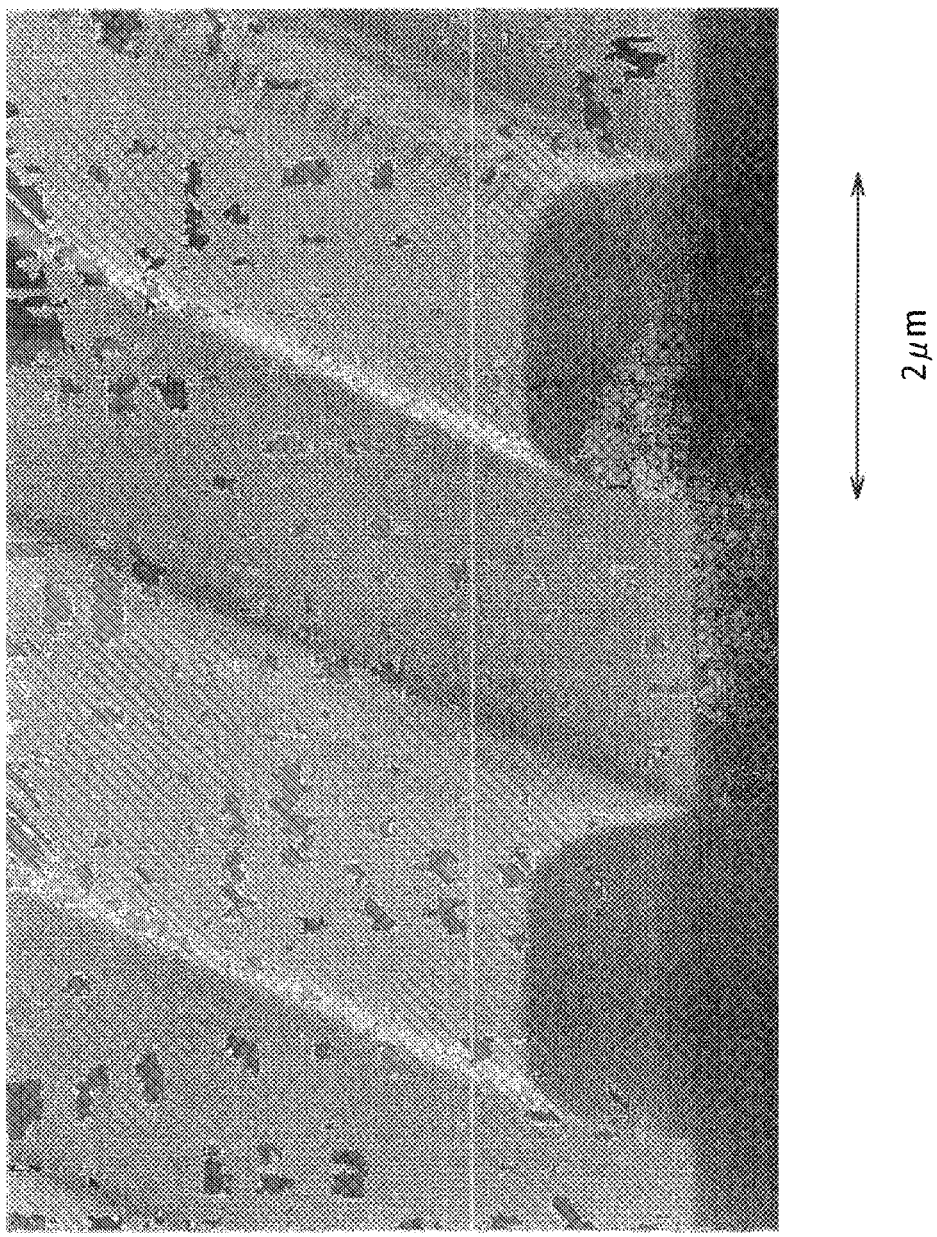
FIG. 24 is a photograph of an aluminum alloy layered wiring line taken under a SEM.

6) Fine-processability of the aluminum alloy layered wiring film was evaluated by observing the sectional shape of resist-coated wiring lines formed by patterning the aluminum alloy layered wiring film by dry etching using a chlorine plasma, and residues remaining on the wiring lines under a SEM. FIG. 23 shows the wiring lines in detail. Fine-processability was graded good when any residues of the wiring material were not found in grooves between the adjacent wiring lines as shown in FIG. 23 and was marked with a circle or graded bad when some residues produced by etching were found in the grooves between the adjacent wiring lines as shown in FIG. 24 and was marked with a cross.

The aluminum alloy layered wiring film was marked with a double circle when all of resistivity, contact resistance, heat resistance and fine-processability are marked with a double circle, was marked with a circle when at least one of resistivity, contact resistance, heat resistance and fine-processability was marked with a circle or was marked with a cross when at least one of resistivity, contact resistance, heat resistance and fine-processability is marked with a cross.

Table 1 shows the influence of the amount in atomic percent of the element of the element group Q or Q' contained in an alloy containing Al, the element group Q or Q' and 0.35 at. % La and forming the first layer (X) on resistivity, contact resistance, heat resistance and fine-processability. The thickness of the first layer (X) was 100 nm, the second layer (Y) was made of pure aluminum or an aluminum alloy having a composition shown in Table 1, and the thickness of the layered wiring film was 300 nm.

A wiring film simulating the construction of the conventional wiring film was evaluated for reference. This wiring film had a metal barrier layer (Mo) as a first layer and an aluminum alloy layer containing Al and 2 at. % Nd as a second layer.

TABLE 1

| Composition of first layer (at. %) | Thickness of first layer (nm) | Composition of second layer (at. %) | Overall thickness (nm) | Ratio of the thickness of the first layer to the overall thickness (%) | Resistivity after heating at 350° C. (μΩ·cm) | Grade of electrical resistance | Contact resistance * (Ω) | Grade of contact resistance | Grade of heat resistance | Grade of fine-processability | Quality grade |
|---|---|---|---|---|---|---|---|---|---|---|---|
| Al—0.05Ni—0.35La | 100 | Al | 300 | 33.3 | 3.16 | ◎ | 21k | X | ◎ | ◎ | X |
| Al—0.1Ni—0.35La | 100 | Al | 300 | 33.3 | 3.16 | ◎ | 299 | ○ | ◎ | ◎ | ○ |
| Al—0.5Ni—0.35La | 100 | Al | 300 | 33.3 | 3.19 | ◎ | 240 | ○ | ◎ | ◎ | ○ |
| Al—1Ni—0.35La | 100 | Al | 300 | 33.3 | 3.22 | ◎ | 158 | ◎ | ◎ | ◎ | ◎ |
| Al—2Ni—0.35La | 100 | Al | 300 | 33.3 | 3.28 | ◎ | 66 | ◎ | ◎ | ◎ | ◎ |
| Al—5Ni—0.35La | 100 | Al | 300 | 33.3 | 3.44 | ◎ | 11 | ◎ | ◎ | ◎ | ◎ |
| Al—10Ni—0.35La | 100 | Al | 300 | 33.3 | 3.63 | ◎ | 9 | ◎ | ◎ | X | X |
| Al—0.05Ag—0.35La | 100 | Al | 300 | 33.3 | 3.32 | ◎ | 23k | X | ◎ | ◎ | X |
| Al—0.1Ag—0.35La | 100 | Al | 300 | 33.3 | 3.32 | ◎ | 230 | ○ | ◎ | ◎ | ○ |
| Al—5Ag—0.35La | 100 | Al | 300 | 33.3 | 3.34 | ◎ | 14 | ◎ | ◎ | ◎ | ◎ |
| Al—10Ag—0.35La | 100 | Al | 300 | 33.3 | 3.85 | ◎ | 6 | ◎ | ◎ | X | X |
| Al—0.05Zn—0.35La | 100 | Al | 300 | 33.3 | 3.32 | ◎ | 29k | X | ◎ | ◎ | X |
| Al—0.1Zn—0.35La | 100 | Al | 300 | 33.3 | 3.08 | ◎ | 365 | ○ | ◎ | ◎ | ○ |
| Al—0.5Zn—0.35La | 100 | Al | 300 | 33.3 | 3.15 | ◎ | 248 | ○ | ◎ | ◎ | ○ |
| Al—2Zn—0.35La | 100 | Al | 300 | 33.3 | 3.38 | ◎ | 109 | ◎ | ◎ | ◎ | ◎ |
| Al—10Zn—0.35La | 100 | Al | 300 | 33.3 | 3.91 | ◎ | 25 | ◎ | ◎ | X | X |
| Al—0.05Cu—0.35La | 100 | Al | 300 | 33.3 | 3.18 | ◎ | 36k | X | ◎ | ◎ | X |
| Al—0.1Cu—0.35La | 100 | Al | 300 | 33.3 | 3.18 | ◎ | 358 | ○ | ◎ | ◎ | ○ |
| Al—0.5Cu—0.35La | 100 | Al | 300 | 33.3 | 3.24 | ◎ | 319 | ○ | ◎ | ◎ | ○ |
| Al—2Cu—0.35La | 100 | Al | 300 | 33.3 | 3.41 | ◎ | 200 | ◎ | ◎ | ◎ | ◎ |
| Al—10Cu—0.35La | 100 | Al | 300 | 33.3 | 3.87 | ◎ | 164 | ◎ | ◎ | X | X |
| Al—0.05Co—0.35La | 100 | Al | 300 | 33.3 | 3.16 | ◎ | 26k | X | ◎ | ◎ | X |
| Al—0.1Co—0.35La | 100 | Al | 300 | 33.3 | 3.16 | ◎ | 398 | ○ | ◎ | ◎ | ○ |
| Al—0.5Co—0.35La | 100 | Al | 300 | 33.3 | 3.19 | ◎ | 320 | ○ | ◎ | ◎ | ○ |
| Al—2Co—0.35La | 100 | Al | 300 | 33.3 | 3.29 | ◎ | 211 | ◎ | ◎ | ◎ | ◎ |
| Al—10Co—0.35La | 100 | Al | 300 | 33.3 | 3.63 | ◎ | 88 | ◎ | ◎ | X | X |
| Al—0.5Ni—0.35La | 100 | Al—1Si | 300 | 33.3 | 3.23 | ◎ | 11 | ◎ | ◎ | ◎ | ◎ |
| Al—0.5Ni—0.35La | 100 | Al—1Si | 300 | 33.3 | 3.23 | ◎ | 11 | ◎ | ◎ | ◎ | ◎ |
| Al—0.1Cu—0.35La | 100 | Al—0.3Y | 300 | 33.3 | 3.47 | ◎ | 358 | ○ | ◎ | ◎ | ○ |
| Al—0.05Ag—0.35La | 100 | Al—0.5Nd | 300 | 33.3 | 3.55 | ◎ | 23k | X | ◎ | ◎ | X |
| Al—0.5Cu—0.35La | 100 | Al—0.4Ce | 300 | 33.3 | 4.20 | ○ | 319 | ○ | ◎ | ◎ | ○ |
| Mo | 100 | Al—2Nd | 300 | 33.3 | 5.55 | X | 10 | ◎ | ◎ | X | X |
| Mo | 50 | Al—2Nd | 300 | 16.7 | 4.74 | X | 10 | ◎ | ◎ | X | X |

* "k" indicates ×$10^3$.

As shown in Table 1, when the layered wiring film contained an element of the element group Q or Q' in a content below 0.1 at. %, contact resistance with an ITO film was high and the aluminum alloy layered wiring film was not suitable for practical uses. When the layered wiring film contained an element of the element group Q or Q' in a content above 6 at. %, the resistivity of the aluminum alloy was excessively high for a wiring material and a resistivity intended by the present invention could not be achieved.

Tables 2 and 3 shows the effect of the type of the element of the element group R and element group R content of an aluminum alloy containing Al, 2 at. % Ni and element group R and forming the first layer (X) on resistivity, contact resistance, heat resistance and fine-processability. The thickness of the first layer (X) was 100 nm, the second layer (Y) was formed of pure aluminum or an aluminum alloy having a composition shown in Table 3, and the thickness of the layered wiring film was 300 nm.

A wiring film simulating the construction of the conventional wiring film was evaluated for reference. This wiring film had a metal barrier layer (Mo) as a first layer and an aluminum alloy layer containing Al and 2 at. % Nd as a second layer.

As obvious from Tables 2 and 3, all the elements of the element group R had similar effects. When the layered wiring film contained an element of the element group R in a content below 0.1 at. %, heat resistance was unsatisfactory and the layered wiring film is not suitable for practical uses. When the layered wiring film contained an element of the element group R in a content above 6 at. %, the layered wiring film is unsatisfactory in fine-processability.

TABLE 2

| Composition of first layer (at. %) | Thickness of first layer (nm) | Composition of second layer (at. %) | Overall thickness (nm) | Ratio of the thickness of the first layer to the overall thickness (%) | Resistivity after heating at 350° C. (μΩ · cm) | Grade of electrical resistance | Contact resistance (Ω) | Grade of contact resistance | Grade of heat resistance | Grade of fine-processability | Quality grade |
|---|---|---|---|---|---|---|---|---|---|---|---|
| Al—2Ni—0.05La | 100 | Al | 300 | 33.3 | 3.2 | ⊙ | 128 | ⊙ | X | ⊙ | X |
| Al—2Ni—0.1La | 100 | Al | 300 | 33.3 | 3.2 | ⊙ | 134 | ⊙ | ⊙ | ⊙ | ⊙ |
| Al—2Ni—0.5La | 100 | Al | 300 | 33.3 | 3.2 | ⊙ | 135 | ⊙ | ⊙ | ⊙ | ⊙ |
| Al—2Ni—1La | 100 | Al | 300 | 33.3 | 3.2 | ⊙ | 139 | ⊙ | ⊙ | ⊙ | ⊙ |
| Al—2Ni—2La | 100 | Al | 300 | 33.3 | 3.3 | ⊙ | 141 | ⊙ | ⊙ | ⊙ | ⊙ |
| Al—2Ni—5La | 100 | Al | 300 | 33.3 | 3.4 | ⊙ | 146 | ⊙ | ⊙ | ⊙ | ⊙ |
| Al—2Ni—10La | 100 | Al | 300 | 33.3 | 3.6 | ⊙ | 152 | ⊙ | ⊙ | X | X |
| Al—2Ni—0.05Nd | 100 | Al | 300 | 33.3 | 3.3 | ⊙ | 124 | ⊙ | X | ⊙ | X |
| Al—2Ni—0.1Nd | 100 | Al | 300 | 33.3 | 3.3 | ⊙ | 127 | ⊙ | ⊙ | ⊙ | ⊙ |
| Al—2Ni—0.5Nd | 100 | Al | 300 | 33.3 | 3.3 | ⊙ | 136 | ⊙ | ⊙ | ⊙ | ⊙ |
| Al—2Ni—1Nd | 100 | Al | 300 | 33.3 | 3.3 | ⊙ | 142 | ⊙ | ⊙ | ⊙ | ⊙ |
| Al—2Ni—2Nd | 100 | Al | 300 | 33.3 | 3.4 | ⊙ | 149 | ⊙ | ⊙ | ⊙ | ⊙ |
| Al—2Ni—5Nd | 100 | Al | 300 | 33.3 | 3.5 | ⊙ | 150 | ⊙ | ⊙ | ⊙ | ⊙ |
| Al—2Ni—10Nd | 100 | Al | 300 | 33.3 | 3.6 | ⊙ | 157 | ⊙ | ⊙ | X | X |
| Al—2Ni—0.05Gd | 100 | Al | 300 | 33.3 | 3.4 | ⊙ | 129 | ⊙ | X | ⊙ | X |
| Al—2Ni—0.1Gd | 100 | Al | 300 | 33.3 | 3.4 | ⊙ | 130 | ⊙ | ⊙ | ⊙ | ⊙ |
| Al—2Ni—1Gd | 100 | Al | 300 | 33.3 | 3.4 | ⊙ | 137 | ⊙ | ⊙ | ⊙ | ⊙ |
| Al—2Ni—5Gd | 100 | Al | 300 | 33.3 | 3.5 | ⊙ | 134 | ⊙ | ⊙ | ⊙ | ⊙ |
| Al—2Ni—10Gd | 100 | Al | 300 | 33.3 | 3.6 | ⊙ | 139 | ⊙ | ⊙ | X | X |
| Al—2Ni—0.05Y | 100 | Al | 300 | 33.3 | 3.3 | ⊙ | 130 | ⊙ | X | ⊙ | X |
| Al—2Ni—0.1Y | 100 | Al | 300 | 33.3 | 3.3 | ⊙ | 135 | ⊙ | ⊙ | ⊙ | ⊙ |
| Al—2Ni—1Y | 100 | Al | 300 | 33.3 | 3.4 | ⊙ | 147 | ⊙ | ⊙ | ⊙ | ⊙ |
| Al—2Ni—5Y | 100 | Al | 300 | 33.3 | 3.5 | ⊙ | 149 | ⊙ | ⊙ | ⊙ | ⊙ |
| Al—2Ni—10Y | 100 | Al | 300 | 33.3 | 3.6 | ⊙ | 153 | ⊙ | ⊙ | X | X |

TABLE 3

| Composition of first layer (at. %) | Thickness of first layer (nm) | Composition of second layer (at. %) | Overall thickness (nm) | Ratio of the thickness of the first layer to the overall thickness (%) | Resistivity after heating at 350° C. (μΩ · cm) | Grade of electrical resistance | Contact resistance (Ω) | Grade of contact resistance | Grade of heat resistance | Grade of fine-processability | Quality grade |
|---|---|---|---|---|---|---|---|---|---|---|---|
| Al—2Ni—0.05V | 100 | Al | 300 | 33.3 | 3.3 | ⊙ | 121 | ⊙ | X | ⊙ | X |
| Al—2Ni—0.1V | 100 | Al | 300 | 33.3 | 3.3 | ⊙ | 126 | ⊙ | ⊙ | ⊙ | ⊙ |
| Al—2Ni—1V | 100 | Al | 300 | 33.3 | 3.3 | ⊙ | 127 | ⊙ | ⊙ | ⊙ | ⊙ |
| Al—2Ni—5V | 100 | Al | 300 | 33.3 | 3.4 | ⊙ | 134 | ⊙ | ⊙ | ⊙ | ⊙ |
| Al—2Ni—10V | 100 | Al | 300 | 33.3 | 3.6 | ⊙ | 138 | ⊙ | ⊙ | X | X |
| Al—2Ni—0.05Fe | 100 | Al | 300 | 33.3 | 3.2 | ⊙ | 124 | ⊙ | X | ⊙ | X |
| Al—2Ni—0.1Fe | 100 | Al | 300 | 33.3 | 3.2 | ⊙ | 129 | ⊙ | ⊙ | ⊙ | ⊙ |
| Al—2Ni—1Fe | 100 | Al | 300 | 33.3 | 3.3 | ⊙ | 137 | ⊙ | ⊙ | ⊙ | ⊙ |
| Al—2Ni—5Fe | 100 | Al | 300 | 33.3 | 3.4 | ⊙ | 139 | ⊙ | ⊙ | ⊙ | ⊙ |
| Al—2Ni—10Fe | 100 | Al | 300 | 33.3 | 3.6 | ⊙ | 154 | ⊙ | ⊙ | X | X |
| Al—2Ni—0.05Mg | 100 | Al | 300 | 33.3 | 3.3 | ⊙ | 135 | ⊙ | X | ⊙ | X |
| Al—2Ni—0.1Mg | 100 | Al | 300 | 33.3 | 3.3 | ⊙ | 139 | ⊙ | ⊙ | ⊙ | ⊙ |
| Al—2Ni—1Mg | 100 | Al | 300 | 33.3 | 3.3 | ⊙ | 148 | ⊙ | ⊙ | ⊙ | ⊙ |
| Al—2Ni—5Mg | 100 | Al | 300 | 33.3 | 3.5 | ⊙ | 150 | ⊙ | ⊙ | ⊙ | ⊙ |

TABLE 3-continued

| Composition of first layer (at. %) | Thickness of first layer (nm) | Composition of second layer (at. %) | Overall thickness (nm) | Ratio of the thickness of the first layer to the overall thickness (%) | Resistivity after heating at 350° C. (μΩ·cm) | Grade of electrical resistance | Contact resistance (Ω) | Grade of contact resistance | Grade of heat resistance | Grade of fine-processability | Quality grade |
|---|---|---|---|---|---|---|---|---|---|---|---|
| Al—2Ni—10Mg | 100 | Al | 300 | 33.3 | 3.6 | ⊚ | 154 | ⊚ | ⊚ | X | X |
| Al—2Ni—1Ce | 100 | Al | 300 | 33.3 | 3.5 | ⊚ | 137 | ⊚ | ⊚ | ⊚ | ⊚ |
| Al—2Ni—1Pr | 100 | Al | 300 | 33.3 | 3.4 | ⊚ | 134 | ⊚ | ⊚ | ⊚ | ⊚ |
| Al—2Ni—1Tb | 100 | Al | 300 | 33.3 | 3.3 | ⊚ | 138 | ⊚ | ⊚ | ⊚ | ⊚ |
| Al—2Ni—1Dy | 100 | Al | 300 | 33.3 | 3.4 | ⊚ | 124 | ⊚ | ⊚ | ⊚ | ⊚ |
| Mo | 100 | Al—2Nd | 300 | 33.3 | 5.6 | X | 10 | ⊚ | ⊚ | X | X |
| Mo | 100 | Al—2Nd | 300 | 16.7 | 4.7 | X | 10 | ⊚ | ⊚ | X | X |

Tables 4, 5 and 6 the influence of the respective thicknesses of the first film (X) and the second film (Y) on the resistivity, contact resistance, heat resistance and fine-processability of the layered wiring film. Different elements of the element group Q or Q' and different elements of the element group R were used in combination, the element of the element group Q or Q' was contained in 2 T at., and the element of the element group R was contained in 0.35 at. % in all the layered wiring films. Heat resistance improved and contact resistance with an ITO film tended to stabilize with the increase of the thickness of the first layer (X). Although resistivity of the wiring line reduced when the first layer (X) was tin, heat resistance tended to deteriorate when the first layer (X) was excessively thin. Although the thickness of the first layer (X) is not a requisite condition of the present invention, it is desirable to adjust the thickness of the first layer (X) to the foregoing desirable thickness to ensure exhibiting the characteristics of the present invention.

TABLE 4

| Composition of first layer (at. %) | Thickness of first layer (nm) | Composition of second layer (at. %) | Overall thickness (nm) | Ratio of the thickness of the first layer to the overall thickness (%) | Resistivity after heating at 350° C. (μΩ·cm) | Grade of electrical resistance | Contact resistance * (Ω) | Grade of contact resistance | Grade of heat resistance | Grade of fine-processability | Quality grade |
|---|---|---|---|---|---|---|---|---|---|---|---|
| Al—2Ni—0.35La | 10 | Al | 300 | 3.3 | 3.0 | ⊚ | 2k | X | X | ⊚ | X |
| Al—2Ni—0.35La | 30 | Al | 300 | 10.0 | 3.1 | ⊚ | 72 | ⊚ | ⊚ | ⊚ | ⊚ |
| Al—2Ni—0.35La | 150 | Al | 300 | 50.0 | 3.4 | ⊚ | 68 | ⊚ | ⊚ | ⊚ | ⊚ |
| Al—2Ni—0.35La | 200 | Al | 300 | 66.7 | 3.6 | ⊚ | 66 | ⊚ | ⊚ | ⊚ | ⊚ |
| Al—2Ni—0.35Nd | 30 | Al | 300 | 10.0 | 3.1 | ⊚ | 71 | ⊚ | ⊚ | ⊚ | ⊚ |
| Al—2Ni—0.35Nd | 50 | Al | 300 | 16.7 | 3.1 | ⊚ | 65 | ⊚ | ⊚ | ⊚ | ⊚ |
| Al—2Ni—0.35Nd | 150 | Al | 300 | 50.0 | 3.4 | ⊚ | 67 | ⊚ | ⊚ | ⊚ | ⊚ |
| Al—2Ni—0.35Nd | 200 | Al | 300 | 66.7 | 3.6 | ⊚ | 66 | ⊚ | ⊚ | ⊚ | ⊚ |
| Al—2Ni—0.35Y | 30 | Al | 300 | 10.0 | 3.1 | ⊚ | 76 | ⊚ | ⊚ | ⊚ | ⊚ |
| Al—2Ni—0.35Y | 50 | Al | 300 | 16.7 | 3.1 | ⊚ | 70 | ⊚ | ⊚ | ⊚ | ⊚ |
| Al—2Ni—0.35Y | 150 | Al | 300 | 50.0 | 3.5 | ⊚ | 67 | ⊚ | ⊚ | ⊚ | ⊚ |
| Al—2Ni—0.35Y | 200 | Al | 300 | 66.7 | 3.7 | ⊚ | 66 | ⊚ | ⊚ | ⊚ | ⊚ |
| Al—2Ag—0.35La | 30 | Al | 300 | 10.0 | 3.1 | ⊚ | 42 | ⊚ | ⊚ | ⊚ | ⊚ |
| Al—2Ag—0.35La | 50 | Al | 300 | 16.7 | 3.1 | ⊚ | 38 | ⊚ | ⊚ | ⊚ | ⊚ |
| Al—2Ag—0.35La | 150 | Al | 300 | 50.0 | 3.5 | ⊚ | 35 | ⊚ | ⊚ | ⊚ | ⊚ |
| Al—2Ag—0.35La | 200 | Al | 300 | 66.7 | 3.7 | ⊚ | 34 | ⊚ | ⊚ | ⊚ | ⊚ |
| Al—2Ag—0.35Nd | 30 | Al | 300 | 10.0 | 3.1 | ⊚ | 43 | ⊚ | ⊚ | ⊚ | ⊚ |
| Al—2Ag—0.35Nd | 50 | Al | 300 | 16.7 | 3.1 | ⊚ | 37 | ⊚ | ⊚ | ⊚ | ⊚ |
| Al—2Ag—0.35Nd | 150 | Al | 300 | 50.0 | 3.4 | ⊚ | 36 | ⊚ | ⊚ | ⊚ | ⊚ |
| Al—2Ag—0.35Nd | 200 | Al | 300 | 66.7 | 3.6 | ⊚ | 35 | ⊚ | ⊚ | ⊚ | ⊚ |
| Al—2Ag—0.35Y | 30 | Al | 300 | 10.0 | 3.1 | ⊚ | 40 | ⊚ | ⊚ | ⊚ | ⊚ |
| Al—2Ag—0.35Y | 50 | Al | 300 | 16.7 | 3.2 | ⊚ | 39 | ⊚ | ⊚ | ⊚ | ⊚ |
| Al—2Ag—0.35Y | 150 | Al | 300 | 50.0 | 3.5 | ⊚ | 36 | ⊚ | ⊚ | ⊚ | ⊚ |
| Al—2Ag—0.35Y | 200 | Al | 300 | 66.7 | 3.8 | ⊚ | 35 | ⊚ | ⊚ | ⊚ | ⊚ |

* "k" indicates ×10³.

TABLE 5

| Composition of first layer (at. %) | Thickness of first layer (nm) | Composition of second layer (at. %) | Overall thickness (nm) | Ratio of the thickness of the first layer to the overall thickness (%) | Resistivity after heating at 350° C. (μΩ·cm) | Grade of electrical resistance | Contact resistance (Ω) | Grade of contact resistance | Grade of heat resistance | Grade of fine-processability | Quality grade |
|---|---|---|---|---|---|---|---|---|---|---|---|
| Al—2Cu—0.35La | 30 | Al | 300 | 10.0 | 3.1 | ⊚ | 224 | ○ | ⊚ | ⊚ | ○ |
| Al—2Cu—0.35La | 50 | Al | 300 | 16.7 | 3.2 | ⊚ | 215 | ○ | ⊚ | ⊚ | ○ |

TABLE 5-continued

| Composition of first layer (at. %) | Thickness of first layer (nm) | Composition of second layer (at. %) | Overall thickness (nm) | Ratio of the thickness of the first layer to the overall thickness (%) | Resistivity after heating at 350° C. (μΩ·cm) | Grade of electrical resistance | Contact resistance (Ω) | Grade of contact resistance | Grade of heat resistance | Grade of fine-processability | Quality grade |
|---|---|---|---|---|---|---|---|---|---|---|---|
| Al—2Cu—0.35La | 100 | Al | 300 | 33.3 | 3.4 | ◎ | 200 | ◎ | ◎ | ◎ | ◎ |
| Al—2Cu—0.35La | 200 | Al | 300 | 66.7 | 3.9 | ◎ | 201 | ○ | ◎ | ◎ | ○ |
| Al—2Cu—0.35Nd | 30 | Al | 300 | 10.0 | 3.1 | ◎ | 221 | ○ | ◎ | ◎ | ○ |
| Al—2Cu—0.35Nd | 50 | Al | 300 | 16.7 | 3.2 | ◎ | 214 | ○ | ◎ | ◎ | ○ |
| Al—2Cu—0.35Nd | 100 | Al | 300 | 33.3 | 3.4 | ◎ | 200 | ◎ | ◎ | ◎ | ◎ |
| Al—2Cu—0.35Nd | 200 | Al | 300 | 66.7 | 4.0 | ◎ | 198 | ◎ | ◎ | ◎ | ◎ |
| Al—2Cu—0.35Y | 30 | Al | 300 | 10.0 | 3.1 | ◎ | 223 | ○ | ◎ | ◎ | ○ |
| Al—2Cu—0.35Y | 50 | Al | 300 | 16.7 | 3.2 | ◎ | 213 | ○ | ◎ | ◎ | ○ |
| Al—2Cu—0.35Y | 100 | Al | 300 | 33.3 | 3.4 | ◎ | 201 | ○ | ◎ | ◎ | ○ |
| Al—2Cu—0.35Y | 200 | Al | 300 | 66.7 | 4.0 | ◎ | 200 | ◎ | ◎ | ◎ | ◎ |
| Al—2Zn—0.35La | 30 | Al | 300 | 10.0 | 3.1 | ◎ | 132 | ◎ | ◎ | ◎ | ◎ |
| Al—2Zn—0.35La | 50 | Al | 300 | 16.7 | 3.2 | ◎ | 128 | ◎ | ◎ | ◎ | ◎ |
| Al—2Zn—0.35La | 100 | Al | 300 | 33.3 | 3.4 | ◎ | 109 | ◎ | ◎ | ◎ | ◎ |
| Al—2Zn—0.35La | 200 | Al | 300 | 66.7 | 3.9 | ◎ | 108 | ◎ | ◎ | ◎ | ◎ |
| Al—2Zn—0.35Nd | 30 | Al | 300 | 10.0 | 3.1 | ◎ | 129 | ◎ | ◎ | ◎ | ◎ |
| Al—2Zn—0.35Nd | 50 | Al | 300 | 16.7 | 3.2 | ◎ | 124 | ◎ | ◎ | ◎ | ◎ |
| Al—2Zn—0.35Nd | 100 | Al | 300 | 33.3 | 3.4 | ◎ | 109 | ◎ | ◎ | ◎ | ◎ |
| Al—2Zn—0.35Nd | 200 | Al | 300 | 66.7 | 4.0 | ◎ | 107 | ◎ | ◎ | ◎ | ◎ |

TABLE 6

| Composition of first layer (at. %) | Thickness of first layer (nm) | Composition of second layer (at. %) | Overall thickness (nm) | Ratio of the thickness of the first layer to the overall thickness (%) | Resistivity after heating at 350° C. (μΩ·cm) | Grade of electrical resistance | Contact resistance (Ω) | Grade of contact resistance | Grade of heat resistance | Grade of fine-processability | Quality grade |
|---|---|---|---|---|---|---|---|---|---|---|---|
| Al—2Zn—0.35Y | 30 | Al | 300 | 10.0 | 3.1 | ◎ | 131 | ◎ | ◎ | ◎ | ◎ |
| Al—2Zn—0.35Y | 50 | Al | 300 | 16.7 | 3.2 | ◎ | 125 | ◎ | ◎ | ◎ | ◎ |
| Al—2Zn—0.35Y | 100 | Al | 300 | 33.3 | 3.4 | ◎ | 110 | ◎ | ◎ | ◎ | ◎ |
| Al—2Zn—0.35Y | 200 | Al | 300 | 66.7 | 3.9 | ◎ | 108 | ◎ | ◎ | ◎ | ◎ |
| Al—0.5Ni—0.35La | 100 | Al—1Si | 300 | 33.3 | 3.2 | ◎ | 240 | ○ | ◎ | ◎ | ○ |
| Al—0.5Ni—0.35La | 100 | Al—0.3Y | 300 | 33.3 | 3.4 | ◎ | 242 | ○ | ◎ | ◎ | ○ |
| Al—0.5Ni—0.35La | 100 | Al—0.5Nd | 300 | 33.3 | 3.4 | ◎ | 239 | ○ | ◎ | ◎ | ○ |
| Al—0.5Ni—0.35La | 100 | Al—0.4Ce | 300 | 33.3 | 4.1 | ○ | 240 | ○ | ◎ | ○ | ○ |
| Al—2Co—0.35La | 30 | Al | 300 | 10.0 | 3.1 | ◎ | 235 | ○ | ◎ | ◎ | ○ |
| Al—2Co—0.35La | 50 | Al | 300 | 16.7 | 3.1 | ◎ | 226 | ○ | ◎ | ◎ | ○ |
| Al—2Co—0.35La | 100 | Al | 300 | 33.3 | 3.3 | ◎ | 211 | ○ | ◎ | ◎ | ○ |
| Al—2Co—0.35La | 200 | Al | 300 | 66.7 | 3.6 | ◎ | 210 | ○ | ◎ | ◎ | ○ |
| Al—2Co—0.35Nd | 30 | Al | 300 | 10.0 | 3.1 | ◎ | 231 | ○ | ◎ | ◎ | ○ |
| Al—2Co—0.35Nd | 50 | Al | 300 | 16.7 | 3.1 | ◎ | 224 | ○ | ◎ | ◎ | ○ |
| Al—2Co—0.35Nd | 100 | Al | 300 | 33.3 | 3.3 | ◎ | 212 | ○ | ◎ | ◎ | ○ |
| Al—2Co—0.35Nd | 200 | Al | 300 | 66.7 | 3.6 | ◎ | 211 | ○ | ◎ | ◎ | ○ |
| Al—2Co—0.35Y | 30 | Al | 300 | 10.0 | 3.1 | ◎ | 229 | ○ | ◎ | ◎ | ○ |
| Al—2Co—0.35Y | 50 | Al | 300 | 16.7 | 3.1 | ◎ | 218 | ○ | ◎ | ◎ | ○ |
| Al—2Co—0.35Y | 100 | Al | 300 | 33.3 | 3.3 | ◎ | 213 | ○ | ◎ | ◎ | ○ |
| Al—2Co—0.35Y | 200 | Al | 300 | 66.7 | 3.7 | ◎ | 211 | ○ | ◎ | ◎ | ○ |
| Mo | 30 | Al—2Nd | 300 | 10.0 | 4.5 | ○ | 13 | ◎ | ◎ | X | X |
| Mo | 50 | Al—2Nd | 300 | 16.7 | 4.7 | X | 10 | ◎ | ◎ | X | X |
| Mo | 100 | Al—2Nd | 300 | 33.3 | 5.6 | X | 10 | ◎ | ◎ | X | X |
| Mo | 200 | Al—2Nd | 300 | 66.7 | 8.4 | X | 11 | ◎ | ◎ | X | X |

Shown above are the results of experiments made to examine the effects of type and element content of elements of the element group Q or Q' and the element group R and the thickness ratio between the first layer (X) and the second layer (Y). A liquid crystal display was manufactured by way of trial using the aluminum alloy layered wiring film containing elements of desirable types of the element group Q or Q' and the element group R in desirable content and having the first layer (X) of a thickness meeting all the desirable conditions. The performance and display quality of the trial liquid crystal display and the yield of a production line for manufacturing the trial liquid crystal display were equivalent to or higher than those of a liquid crystal display using a conventional layered wiring film including an ITO film, a metal barrier film and an aluminum alloy film and a liquid crystal display using a conventional layered wiring film including an ITO film and an aluminum alloy film.

The contact resistance of the layered wiring film including a 10 nm thick first layer (X) containing Al, 2 Ni and 0.35 La shown in Table 4 is higher than those of other layered wiring films shown in Table 4. It is inferred that the contact resistance of this layered wiring film is high because the second layer, namely, a pure aluminum film, was exposed by overetching.

Thus, it is proved that the present invention can make the omission of a metal barrier layer possible, can ensure excellent heat resistance and can stabilize the direct electrical contact between the first layer (X) and the ITO film at a low contact resistance by specifying the types of elements of the element group Q or Q' and the element group R and contents in which those elements are contained in the first layer (X) (preferably, also the thickness of the first layer (X)).

Example 2

Another example of the aluminum alloy layered wiring film of two-layer construction of the array substrate characterizing the present invention will be described. Results of tests of the chemical resistance (corrosion resistance to the corrosive action of alkali solution) of the aluminum alloy layered wiring film of two-layer construction are shown in Table 7 together with resistivity, contact resistance between a transparent conducting film (ITO film) and the aluminum alloy layered wiring film and heat resistance.

Experiments were conducted under the following conditions.

Experimental conditions are as follows.

1) The second layer (Y) was formed of pure aluminum. The first layer (X) was formed of an aluminum alloy excellent in heat resistance, capable of being in direct contact with the transparent conducting film and containing at least one of the elements of the element group Q' in a predetermined content, at least one of elements of the element group R1 in a predetermined content and at least one of the elements of the element group R2 in a predetermined content. A layered film including the first layer (X) and the second layer (Y) was formed, similarly to Example 1, by sputtering processes. The layered film, namely, the wiring film, had an overall thickness of about 300 nm.

2) Composition of the alloy forming the first layer (X) is shown in Table 7.

3) Chemical corrosion resistance test (alkali corrosion test): A chemical corrosion resistance test simulated a cleaning process using a photoresist remover. A corrosion experiment used an alkali solution prepared by mixing an amine photoresist and water. More specifically, an aqueous solution of an amine resist remover (TOK106, Tokyo Ohka Kogyo Co., Ltd.) of pH 10 and 25° C. was prepared. A layered film including an aluminum alloy layer and a pure aluminum layer processed beforehand by a heating process at 350° C. for 30 min was immersed in the aqueous solution for 300 s. The surface of the layered film immersed in the aqueous solution was observed and rounded cavities formed in the surface by pitting corrosion were counted to evaluate the corrosion resistance of the layered film. Layered films having rounded cavities in a density below $7 \times 10^9 / m^2$ were graded excellent, and marked with double circle, those having rounded cavities in a density not lower than $7 \times 10^9 / m^2$ and below $30 \times 10^9 / m^2$ were graded fair and marked with a circle, and those having rounded cavities in a density equal to or above $30 \times 10^9 / m^2$ were graded bad and marked with a cross.

4) The resistivity, contact resistance between the transparent conducting film (ITO film) and the aluminum alloy layered wiring film and heat resistance of Example 2 sere evaluated similarly to those of Example 1.

TABLE 7

| Composition of first layer (at. %) | Thickness of first layer (nm) | Composition of second layer (at. %) | Overall thickness (nm) | Ratio of the thickness of the first layer to the overall thickness (%) | Resistivity after heating at 350° C. (μΩ·cm) | Grade of electrical resistance |
|---|---|---|---|---|---|---|
| Al—1Ni—0.35La—0.05Ti | 100 | Al | 300 | 33.3 | 3.4 | ⊚ |
| Al—1Ni—0.35La—0.1Ti | 100 | Al | 300 | 33.3 | 3.5 | ⊚ |
| Al—1Ni—0.35La—0.5Ti | 100 | Al | 300 | 33.3 | 3.8 | ⊚ |
| Al—1Ni—0.35La—1Ti | 100 | Al | 300 | 33.3 | 4.0 | ⊚ |
| Al—1Ni—0.35La—2Ti | 100 | Al | 300 | 33.3 | 4.1 | ○ |
| Al—1Ni—0.35La—0.05Nb | 100 | Al | 300 | 33.3 | 3.4 | ⊚ |
| Al—1Ni—0.35La—0.1Nb | 100 | Al | 300 | 33.3 | 3.4 | ⊚ |
| Al—1Ni—0.35La—0.5Nb | 100 | Al | 300 | 33.3 | 3.8 | ⊚ |
| Al—1Ni—0.35La—1Nb | 100 | Al | 300 | 33.3 | 4.0 | ⊚ |
| Al—1Ni—0.35La—2Nb | 100 | Al | 300 | 33.3 | 4.2 | ○ |
| Al—1Ni—0.35La—0.05Ta | 100 | Al | 300 | 33.3 | 3.4 | ⊚ |
| Al—1Ni—0.35La—0.1Ta | 100 | Al | 300 | 33.3 | 3.4 | ⊚ |
| Al—1Ni—0.35La—0.5Ta | 100 | Al | 300 | 33.3 | 3.8 | ⊚ |
| Al—1Ni—0.35La—1Ta | 100 | Al | 300 | 33.3 | 4.0 | ⊚ |
| Al—1Ni—0.35La—2Ta | 100 | Al | 300 | 33.3 | 4.2 | ○ |
| Al—1Ni—0.35La—0.05Cr | 100 | Al | 300 | 33.3 | 3.4 | ⊚ |
| Al—1Ni—0.35La—0.1Cr | 100 | Al | 300 | 33.3 | 3.4 | ⊚ |
| Al—1Ni—0.35La—0.5Cr | 100 | Al | 300 | 33.3 | 3.8 | ⊚ |
| Al—1Ni—0.35La—1Cr | 100 | Al | 300 | 33.3 | 4.0 | ⊚ |
| Al—1Ni—0.35La—2Cr | 100 | Al | 300 | 33.3 | 4.2 | ○ |
| Al—1Ni—0.35La—0.05Zr | 100 | Al | 300 | 33.3 | 3.3 | ⊚ |
| Al—1Ni—0.35La—0.1Zr | 100 | Al | 300 | 33.3 | 3.4 | ⊚ |
| Al—1Ni—0.35La—0.5Zr | 100 | Al | 300 | 33.3 | 3.6 | ⊚ |
| Al—1Ni—0.35La—1Zr | 100 | Al | 300 | 33.3 | 3.8 | ⊚ |
| Al—1Ni—0.35La—2Zr | 100 | Al | 300 | 33.3 | 4.0 | ⊚ |
| Al—1Ni—0.35La—0.05Ti—0.05Nb | 100 | Al | 300 | 33.3 | 3.4 | ⊚ |
| Al—1Ni—0.35La—0.1Ta—0.1Cr | 100 | Al | 300 | 33.3 | 3.6 | ⊚ |
| Al—1Ni—0.35La—0.3Zr—0.2Ti | 100 | Al | 300 | 33.3 | 3.7 | ⊚ |
| Al—0.5Ni—0.5Cu—0.35La—0.05Ti | 100 | Al | 300 | 33.3 | 3.6 | ⊚ |
| Al—0.5Ni—0.5Ag—0.35La—0.1Nb | 100 | Al | 300 | 33.3 | 3.6 | ⊚ |
| Al—0.5Ni—0.5Co—0.35La—0.5Ta | 100 | Al | 300 | 33.3 | 3.9 | ⊚ |

TABLE 7-continued

TABLE 7

| Composition | | | | | | |
|---|---|---|---|---|---|---|
| Al—1Ni—1Cu—1La—1Nb | 100 | Al | 301 | 33.2 | 4.0 | ◉ |
| Al—1Ni—1Cu—1La—1Ti | 100 | Al | 302 | 33.1 | 4.0 | ◉ |
| Al—0.5Ni—2Cu—1La—0.5Nb | 100 | Al | 303 | 33.0 | 3.9 | ◉ |
| Al—0.5Ni—2Cu—1La—0.5Ti | 100 | Al | 304 | 32.9 | 3.9 | ◉ |
| Al—0.2Ni—2Cu—1La—0.5Nb | 100 | Al | 305 | 32.8 | 3.9 | ◉ |
| Al—0.2Ni—2Cu—1La—0.5Ti | 100 | Al | 306 | 32.7 | 2.9 | ◉ |

| Composition of first layer (at. %) | Contact resistance (Ω) | Grade of contact resistance | Grade of heat resistance | Grade of fine-processability | Quality grade |
|---|---|---|---|---|---|
| Al—1Ni—0.35La—0.05Ti | 158 | ◉ | ◉ | ○ | ○ |
| Al—1Ni—0.35La—0.1Ti | 157 | ◉ | ◉ | ◉ | ◉ |
| Al—1Ni—0.35La—0.5Ti | 155 | ◉ | ◉ | ◉ | ◉ |
| Al—1Ni—0.35La—1Ti | 156 | ◉ | ◉ | ◉ | ◉ |
| Al—1Ni—0.35La—2Ti | 153 | ◉ | ◉ | ◉ | ○ |
| Al—1Ni—0.35La—0.05Nb | 159 | ◉ | ◉ | ○ | ○ |
| Al—1Ni—0.35La—0.1Nb | 158 | ◉ | ◉ | ◉ | ◉ |
| Al—1Ni—0.35La—0.5Nb | 156 | ◉ | ◉ | ◉ | ◉ |
| Al—1Ni—0.35La—1Nb | 153 | ◉ | ◉ | ◉ | ◉ |
| Al—1Ni—0.35La—2Nb | 154 | ◉ | ◉ | ◉ | ○ |
| Al—1Ni—0.35La—0.05Ta | 160 | ◉ | ◉ | ○ | ○ |
| Al—1Ni—0.35La—0.1Ta | 159 | ◉ | ◉ | ◉ | ◉ |
| Al—1Ni—0.35La—0.5Ta | 157 | ◉ | ◉ | ◉ | ◉ |
| Al—1Ni—0.35La—1Ta | 152 | ◉ | ◉ | ◉ | ◉ |
| Al—1Ni—0.35La—2Ta | 156 | ◉ | ◉ | ◉ | ○ |
| Al—1Ni—0.35La—0.05Cr | 157 | ◉ | ◉ | ○ | ○ |
| Al—1Ni—0.35La—0.1Cr | 158 | ◉ | ◉ | ◉ | ◉ |
| Al—1Ni—0.35La—0.5Cr | 154 | ◉ | ◉ | ◉ | ◉ |
| Al—1Ni—0.35La—1Cr | 153 | ◉ | ◉ | ◉ | ◉ |
| Al—1Ni—0.35La—2Cr | 157 | ◉ | ◉ | ◉ | ○ |
| Al—1Ni—0.35La—0.05Zr | 154 | ◉ | ◉ | ○ | ○ |
| Al—1Ni—0.35La—0.1Zr | 158 | ◉ | ◉ | ◉ | ◉ |
| Al—1Ni—0.35La—0.5Zr | 153 | ◉ | ◉ | ◉ | ◉ |
| Al—1Ni—0.35La—1Zr | 157 | ◉ | ◉ | ◉ | ◉ |
| Al—1Ni—0.35La—2Zr | 159 | ◉ | ◉ | ◉ | ◉ |
| Al—1Ni—0.35La—0.05Ti—0.05Nb | 157 | ◉ | ◉ | ◉ | ◉ |
| Al—1Ni—0.35La—0.1Ta—0.1Cr | 154 | ◉ | ◉ | ◉ | ◉ |
| Al—1Ni—0.35La—0.3Zr—0.2Ti | 158 | ◉ | ◉ | ◉ | ◉ |
| Al—0.5Ni—0.5Cu—0.35La—0.05Ti | 239 | ○ | ◉ | ◉ | ○ |
| Al—0.5Ni—0.5Ag—0.35La—0.1Nb | 97 | ◉ | ◉ | ◉ | ◉ |
| Al—0.5Ni—0.5Co—0.35La—0.5Ta | 176 | ◉ | ◉ | ◉ | ◉ |
| Al—1Ni—1Cu—1La—1Nb | 221 | ◉ | ◉ | ◉ | ○ |
| Al—1Ni—1Cu—1La—1Ti | 220 | ◉ | ◉ | ◉ | ○ |
| Al—0.5Ni—2Cu—1La—0.5Nb | 180 | ◉ | ◉ | ◉ | ◉ |
| Al—0.5Ni—2Cu—1La—0.5Ti | 178 | ◉ | ◉ | ◉ | ◉ |
| Al—0.2Ni—2Cu—1La—0.5Nb | 186 | ◉ | ◉ | ◉ | ◉ |
| Al—0.2Ni—2Cu—1La—0.5Ti | 187 | ◉ | ◉ | ◉ | ◉ |

Measured data sown in Table 7 ensures that corrosion resistance (chemical resistance) against the corrosive action of a strong alkali solution can be improved without increasing the electric resistance of wiring lines, without deteriorating the heat resistance of wiring lines, and suppressing the increase of the contact resistance between the ITO film and the aluminum alloy layered wiring film (without deteriorating boundary conducting characteristic) by forming an aluminum alloy wiring film containing the element group R2 in addition to the element group R1.

Although the present invention has been described in its preferred embodiments, it is obvious to those skilled in the art that various changes and modifications are possible without departing from the scope and spirit of the present invention.

The present patent application is based upon Jpn. Pat. App. No. 2006-251473 filed on Sep. 15, 2006 and Jpn. Pat. App. No. 2007-210218 applied on Aug. 10, 2007, the entire contents of which are incorporated herein by reference.

All the references cited herein are incorporated herein.

INDUSTRIAL APPLICABILITY

The wiring film of the present invention has high heat resistance and is a layered structure including the first layer (X) of the aluminum alloy capable of being in direct contact with the transparent conducting film, and the second layer (Y) of pure aluminum or an aluminum alloy having a resistivity lower than that of the first layer (X). Thus, the wiring film has a low resistivity, high heat resistance and good shape characteristic. The aluminum alloy layered wiring film can be in direct contact with the transparent conducting film. Since the aluminum alloy layered wiring film featuring the present invention is formed by superposing a layer of an aluminum alloy and a layer of pure aluminum or an aluminum alloy of the same category, the difference between etch rates at which the superposed layers are etched, respectively, is not large, the aluminum alloy layered wiring film can be easily patterned and is excellent in fine-processability.

Corrosion of the aluminum alloy wiring film in the manufacturing process for manufacturing a display can be suppressed and a display having a satisfactory display quality can be manufactured by adding at last one of the elements of the element group R2 to the material forming the first layer (X).

The invention claimed is:

1. A display comprising a glass substrate provided with a transparent conducting film, thin-film transistors, and an aluminum alloy wiring film electrically connecting the thin-film transistors to the transparent conducting film;
wherein the aluminum alloy wiring film is a layered structure having a first layer (X) of an aluminum alloy comprising at least one element selected from the element group Q consisting of Ni, Ag, Zn and Cu in a content in the range of 0.1 to 6 at. %, and at least one element selected from the element group R consisting of rare-earth elements, Mg, Mn, V, Pt, Cr, Ru, Rh, Pd, Ir, W, Ti, Zr, Nb, Hf, Ta, Sn and Fe in a content in the range of 0.1 to 6 at. %, and a second layer (Y) of pure aluminum or an aluminum alloy containing aluminum as a principal component and having a resistivity lower than that of the first layer (X), and the first layer (X) is in direct contact with the transparent conducting film.

2. The display according to claim 1, wherein the first layer (X) has a thickness of 20 nm or above.

3. The display according to claim 2, wherein the aluminum alloy wiring film including the first layer (X) and the second layer (Y) has a resistivity of 4.5 $\mu\Omega\cdot$cm or below.

4. The display according to claim 1, wherein the aluminum alloy wiring film including the first layer (X) and the second layer (Y) has a resistivity of 4.5 $\mu\Omega\cdot$cm or below.

5. A display comprising a glass substrate provided with a transparent conducting film, thin-film transistors, and an aluminum alloy wiring film electrically connecting the thin-film transistors to the transparent conducting film;
wherein the aluminum alloy wiring film is a layered structure having a first layer (X) of an aluminum alloy comprising at least one element selected from the element group Q' consisting of Ni, Ag, Zn, Cu, and Co in a content in the range of 0.1 to 6 at. %, and at least one element selected from the element group R consisting of rare-earth elements, Mg, Mn, V, Pt, Cr, Ru, Rh, Pd, Ir, W, Ti, Zr, Nb, Hf, Ta, Sn and Fe in a content in the range of 0.1 to 6 at. %, and a second layer (Y) of pure aluminum or an aluminum alloy containing aluminum as a principal component and having a resistivity lower than that of the first layer (X), and the first layer (X) is in direct contact with the transparent conducting film.

6. The display according to claim 5, wherein the first layer (X) has a thickness of 20 nm or above.

7. The display according to claim 6, wherein the aluminum alloy wiring film including the first layer (X) and the second layer (Y) has a resistivity of 4.5 $\mu\Omega\cdot$cm or below.

8. The display according to claim 5, wherein the aluminum alloy wiring film including the first layer (X) and the second layer (Y) has a resistivity of 4.5 $\mu\Omega\cdot$cm or below.

9. A display comprising a glass substrate provided with a transparent conducting film, thin-film transistors, and an aluminum alloy wiring film electrically connecting the thin-film transistors to the transparent conducting film;
wherein the aluminum alloy wiring film is a layered structure having a first layer (X) of an aluminum alloy comprising at least one element selected from the element group Q' consisting of Ni, Ag, Zn, Cu, and Co in a content in the range of 0.1 to 6 at. %, and at least one element selected from the rare-earth element group R1 and at least one element selected from the element group R2 consisting of Mg, Mn, V, Pt, Cr, Ru, Rh, Pd, Ir, W, Ti, Zr, Nb, Hf, Ta, Sn and Fe in a total content of the element group R1 plus the element group R2 in the range of 0.1 to 6 at. %, and a second layer (Y) of pure aluminum or an aluminum alloy containing aluminum as a principal component and having a resistivity lower than that of the first layer (X), and the first layer (X) is in direct contact with the transparent conducting film.

10. The display according to claim 9, wherein the rare-earth element group R1 consists of La, Gd, Y, Nd and Dy.

11. The display according to claim 10, wherein the element group R2 consists of Cr, Ti, Zr, Nb and Ta.

12. The display according to claim 9, wherein the element group R2 consists of Cr, Ti, Zr, Nb and Ta.

13. The display according to claim 9, wherein the first layer (X) has a thickness of 20 nm or above.

14. The display according to claim 13, wherein the aluminum alloy wiring film including the first layer (X) and the second layer (Y) has a resistivity of 4.5 $\mu\Omega\cdot$cm or below.

15. The display according to claim 9, wherein the aluminum alloy wiring film including the first layer (X) and the second layer (Y) has a resistivity of 4.5 $\mu\Omega\cdot$cm or below.

* * * * *